United States Patent
Chanemougame et al.

(10) Patent No.: US 10,566,248 B1
(45) Date of Patent: Feb. 18, 2020

(54) WORK FUNCTION METAL PATTERNING FOR N-P SPACES BETWEEN ACTIVE NANOSTRUCTURES USING UNITARY ISOLATION PILLAR

(71) Applicant: GLOBALFOUNDRIES INC., Grand Cayman (KY)

(72) Inventors: Daniel Chanemougame, Niskayuna, NY (US); Ruilong Xie, Schenectady, NY (US); Chanro Park, Clifton Park, NY (US); Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/047,044

(22) Filed: Jul. 27, 2018

(51) Int. Cl.
H01L 21/8238 (2006.01)
H01L 27/092 (2006.01)
H01L 29/423 (2006.01)
H01L 29/06 (2006.01)

(52) U.S. Cl.
CPC ........... H01L 21/823878 (2013.01); H01L 21/823807 (2013.01); H01L 21/823821 (2013.01); H01L 21/823842 (2013.01); H01L 27/0924 (2013.01); H01L 29/0673 (2013.01); H01L 29/42392 (2013.01)

(58) Field of Classification Search
CPC ..... H01L 21/823878; H01L 21/823807; H01L 21/823821; H01L 21/823842; H01L 27/0924; H01L 29/0673; H01L 29/42392
See application file for complete search history.

(56) References Cited

U.S. PATENT DOCUMENTS

| | | | |
|---|---|---|---|
| 6,017,496 A | 1/2000 | Nova et al. | |
| 6,100,026 A | 8/2000 | Nova et al. | |
| 6,284,459 B1 | 9/2001 | Nova et al. | |
| 6,319,668 B1 | 11/2001 | Nova et al. | |
| 9,653,289 B1 | 5/2017 | Balakrishnan et al. | |
| 10,074,727 B2* | 9/2018 | Adusumilli | H01L 29/45 |
| 10,103,065 B1* | 10/2018 | Mochizuki | H01L 21/82384 |
| 2016/0233298 A1 | 8/2016 | Webb et al. | |
| 2017/0133459 A1* | 5/2017 | Pranatharthiharan | H01L 29/0649 |
| 2018/0342427 A1* | 11/2018 | Xie | H01L 21/82387 |
| 2018/0350695 A1* | 12/2018 | Cheng | H01L 21/82348 |

FOREIGN PATENT DOCUMENTS

GB        2510716 A      8/2014

OTHER PUBLICATIONS

U.S. Appl. No. 16/047,043, Notice of Allowance dated Sep. 11, 2019, 12 pages.

* cited by examiner

Primary Examiner — Yosef Gebreyesus
(74) Attorney, Agent, or Firm — Anthony Canale; Hoffman Warnick LLC

(57) ABSTRACT

A method includes forming an isolation pillar between first and second active nanostructures for adjacent FETs. When a first WFM surrounding the second active nanostructure is removed as part of a WFM patterning process, creating a discontinuity in the first metal. The pillar or the discontinuity in the first metal on the part of the pillar prevent the etching from reaching and removing the first WFM on the first active nanostructure. The isolation pillar creates a gate cut isolation in a selected gate region, and can be shortened in another gate region to allow for gate sharing between adjacent FETs.

6 Claims, 18 Drawing Sheets

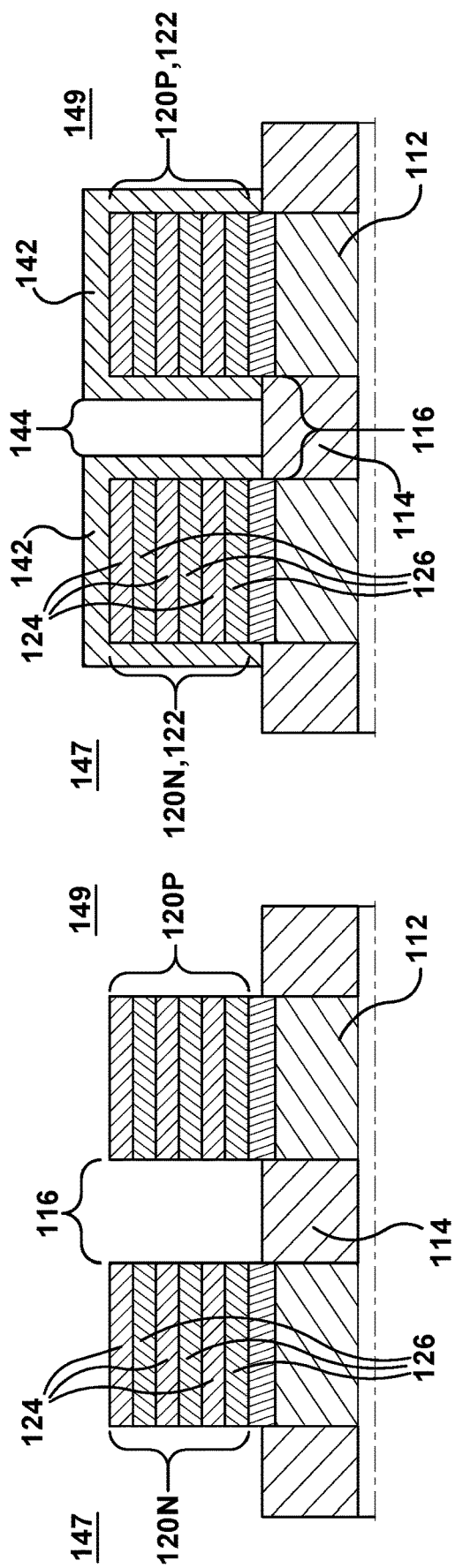

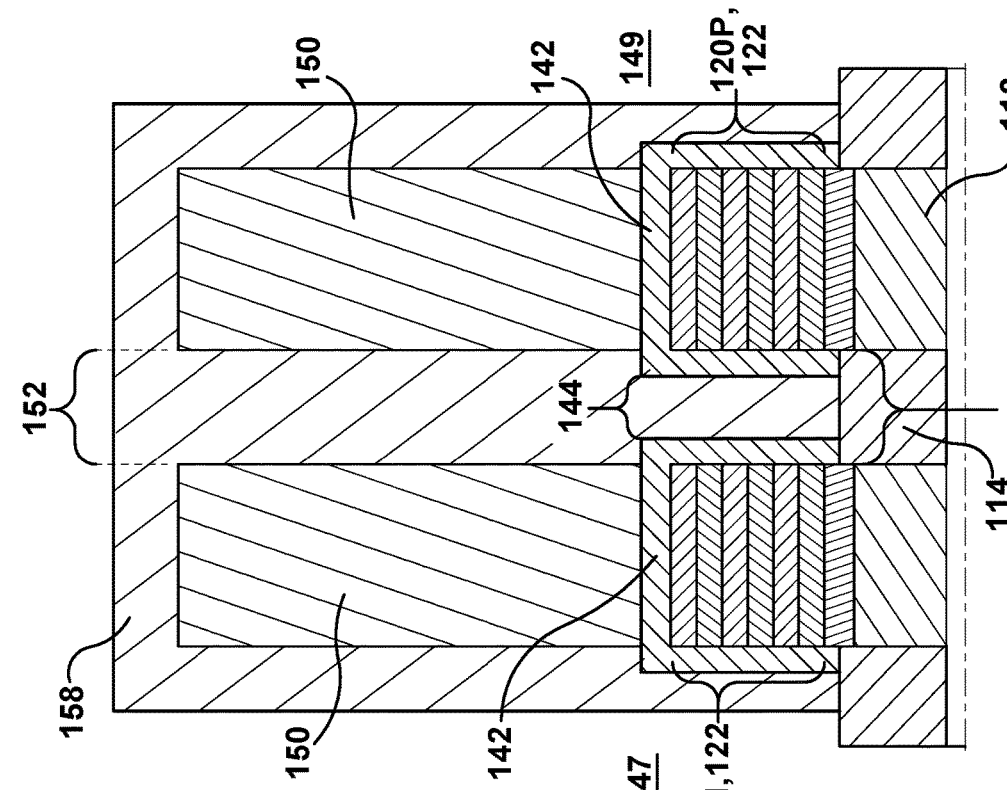
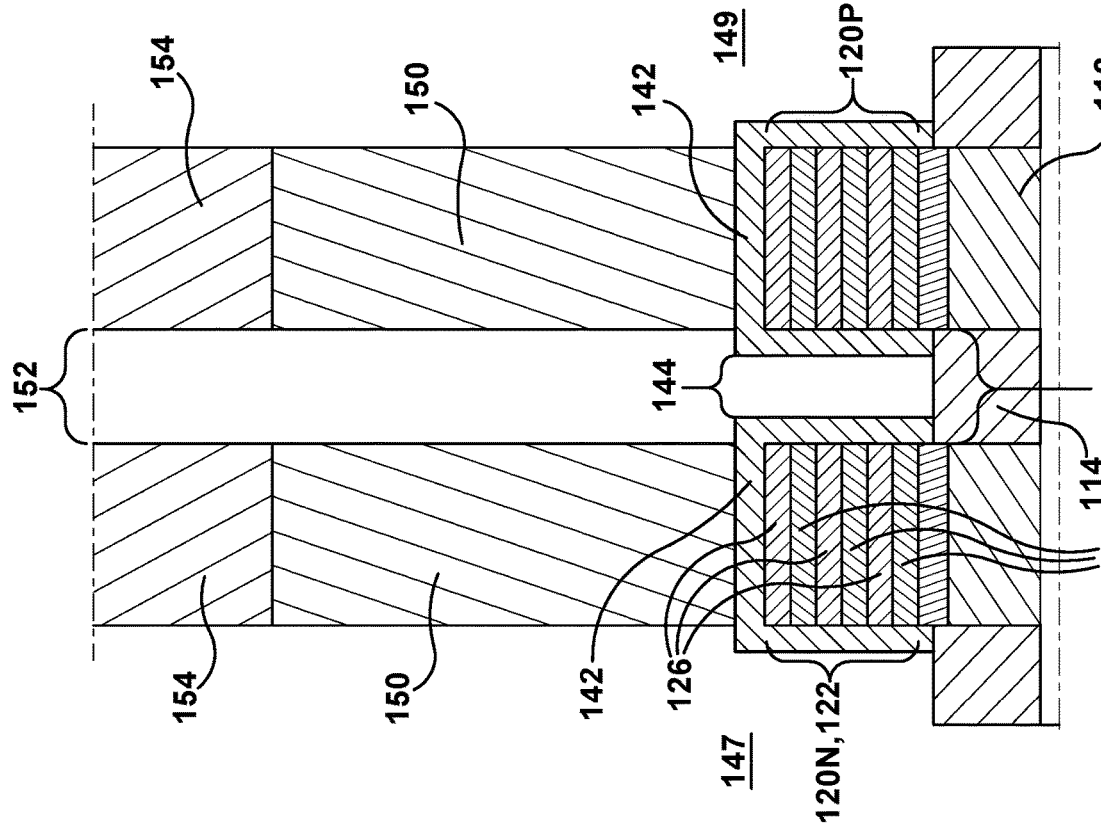

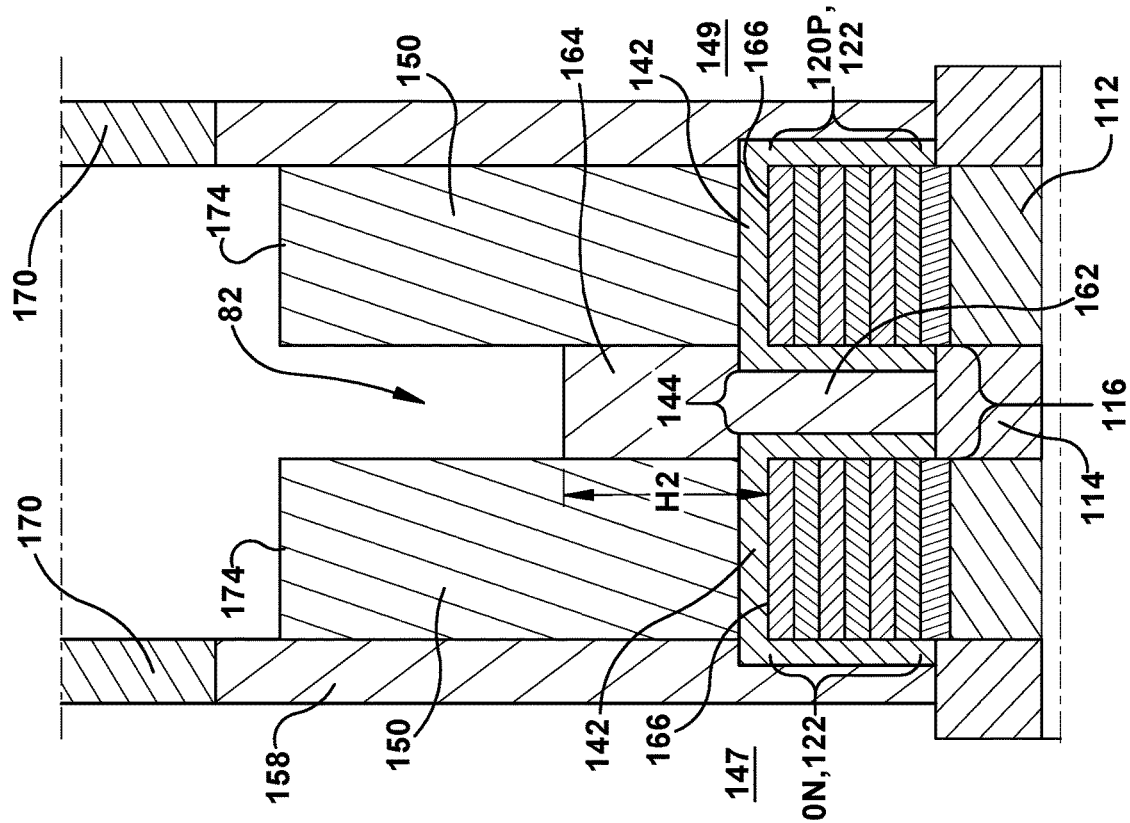
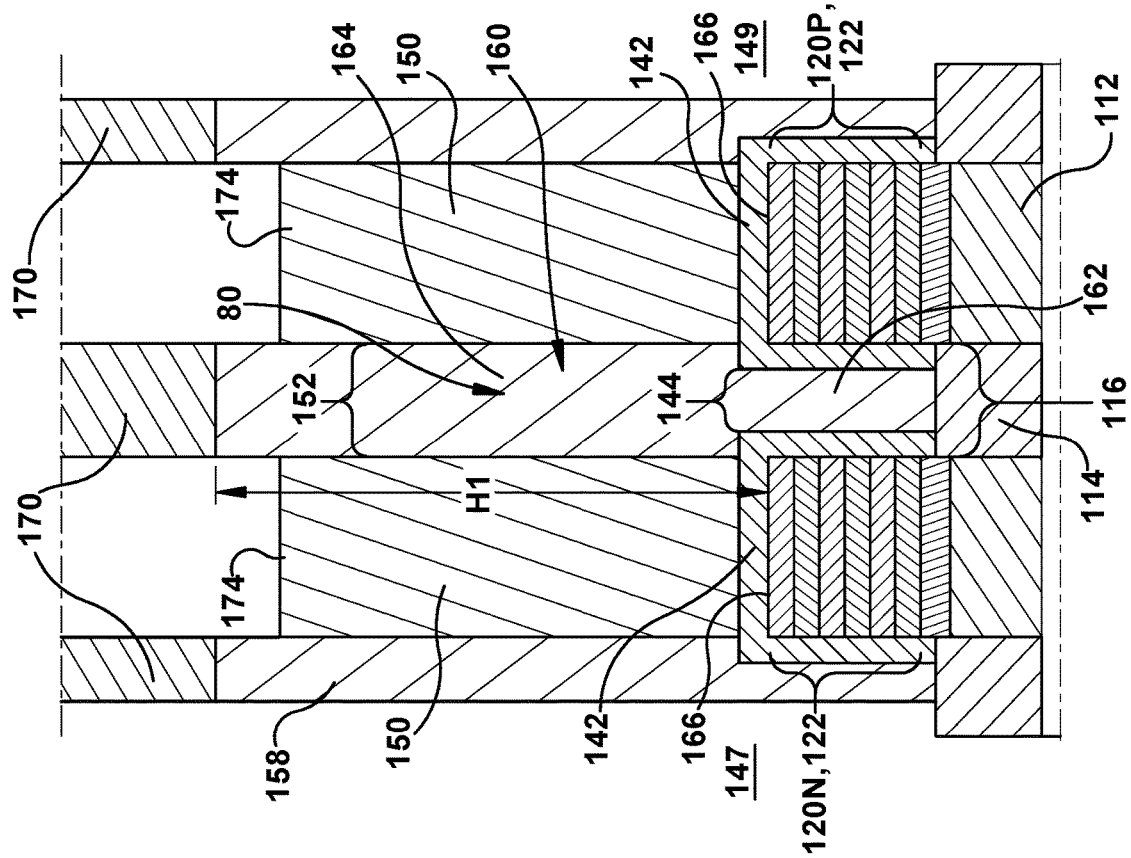

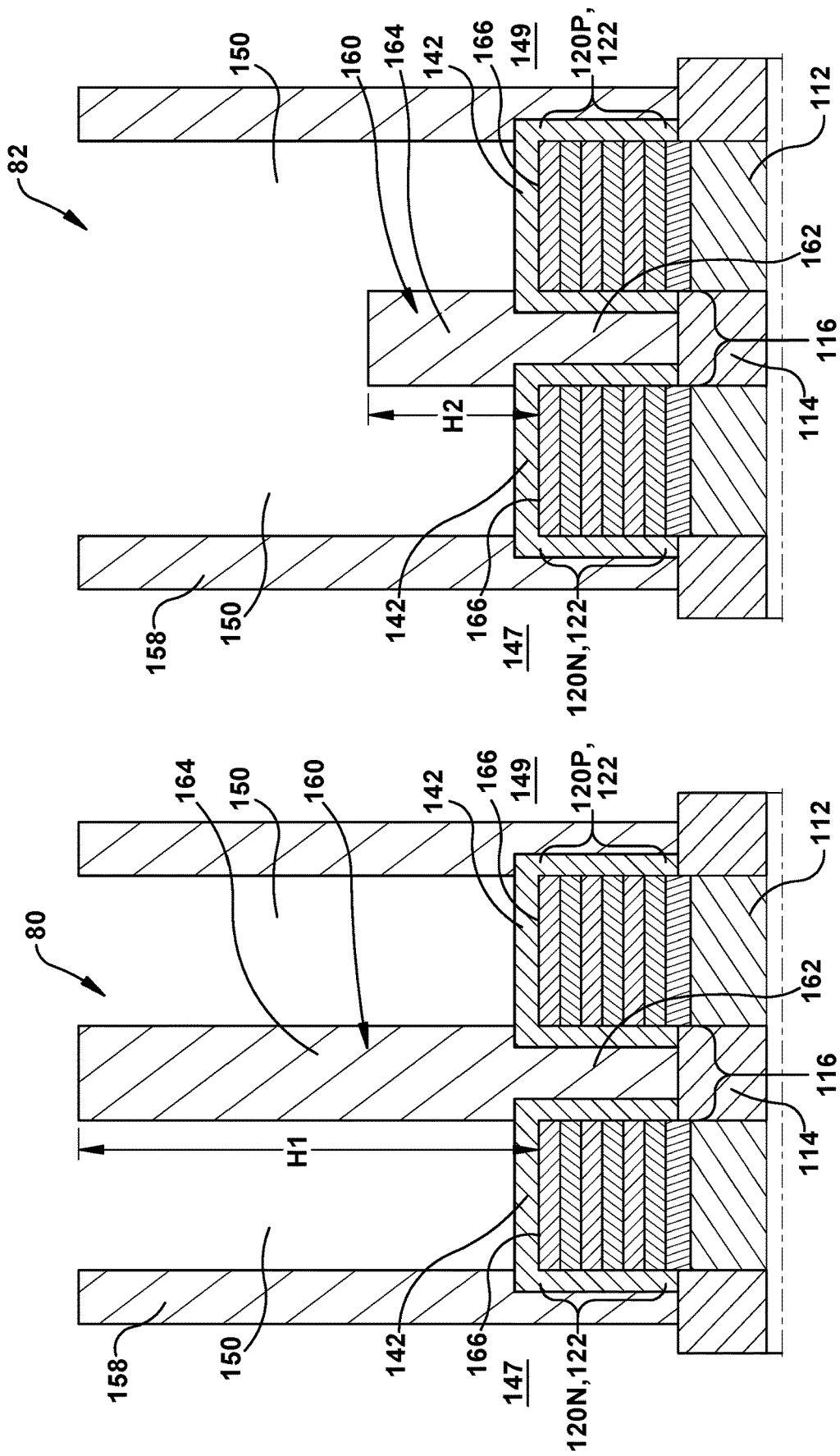

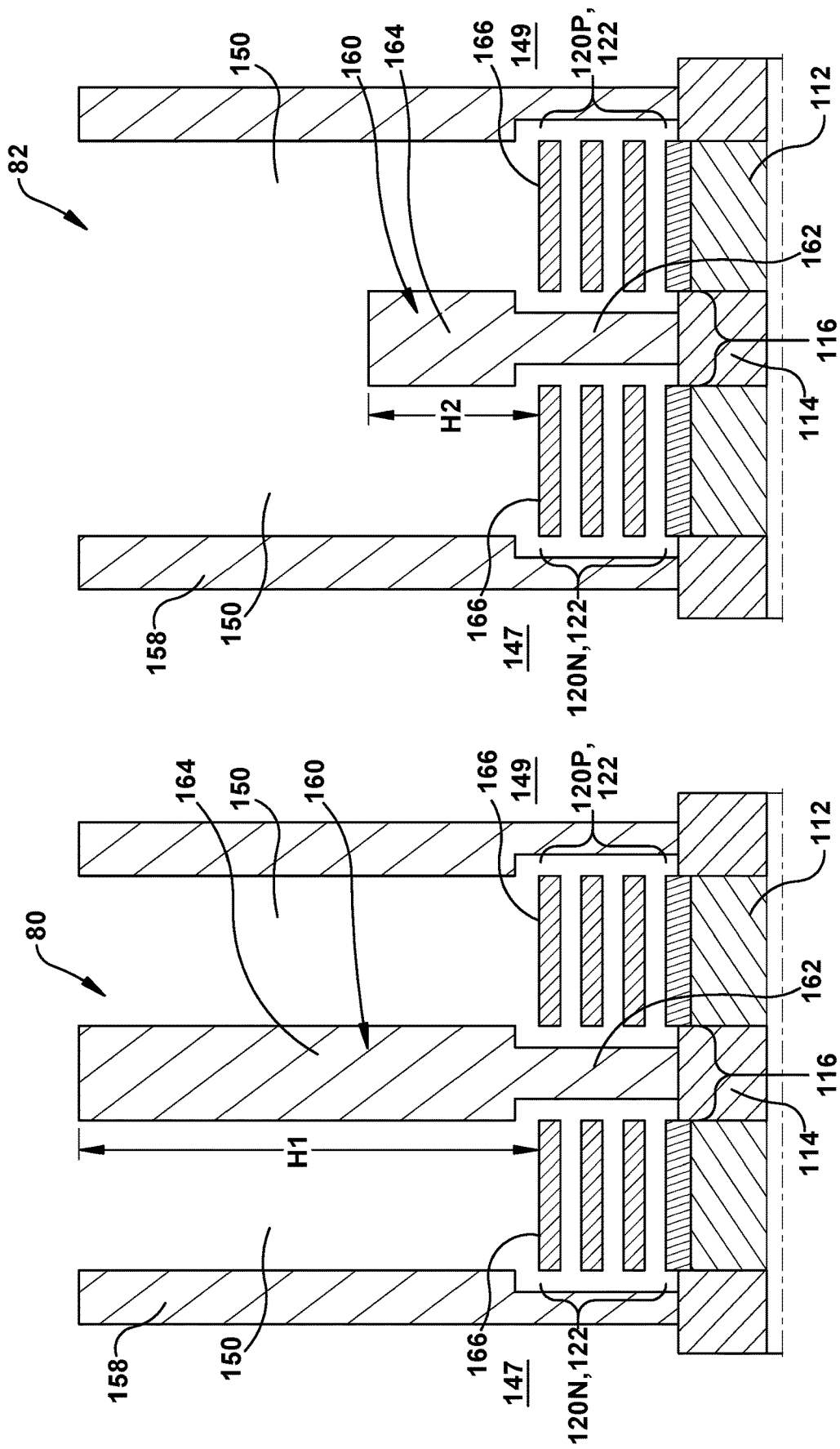

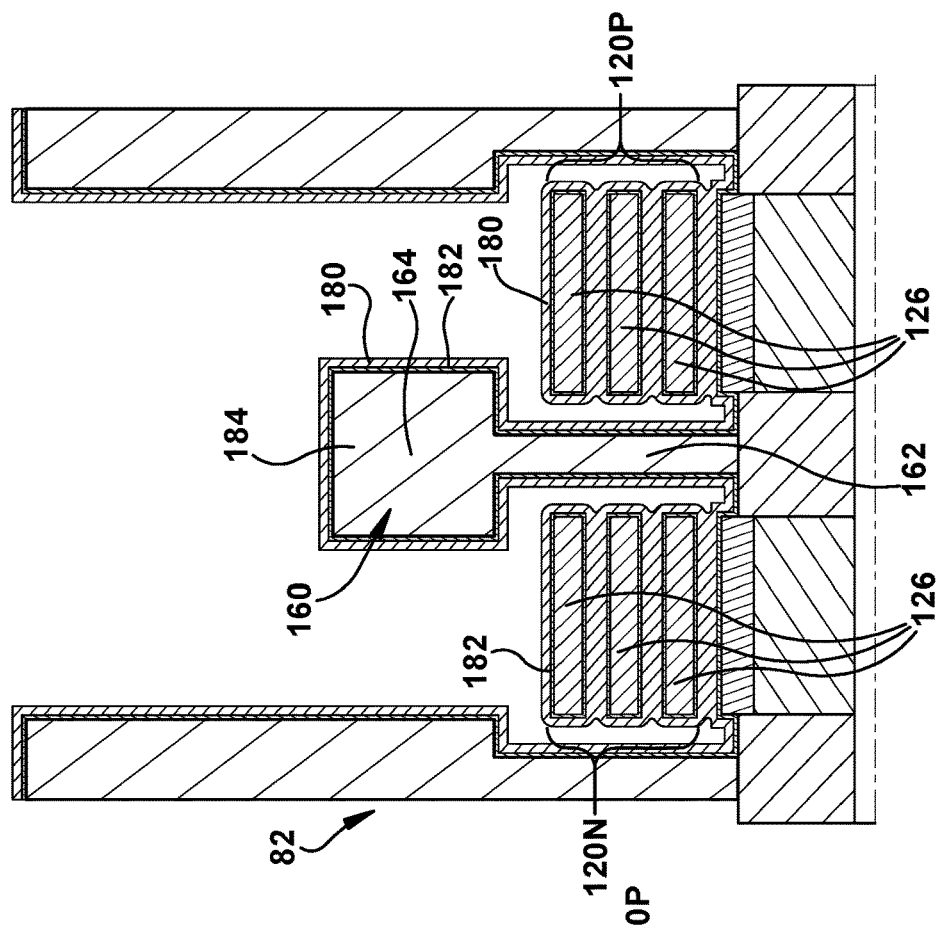
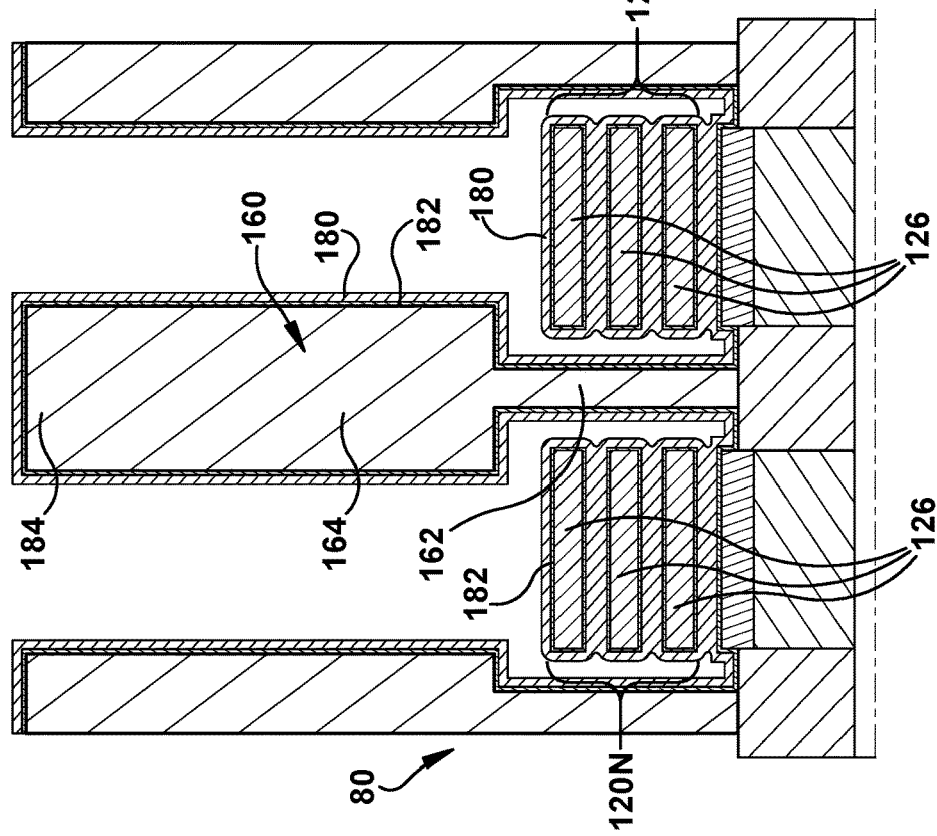

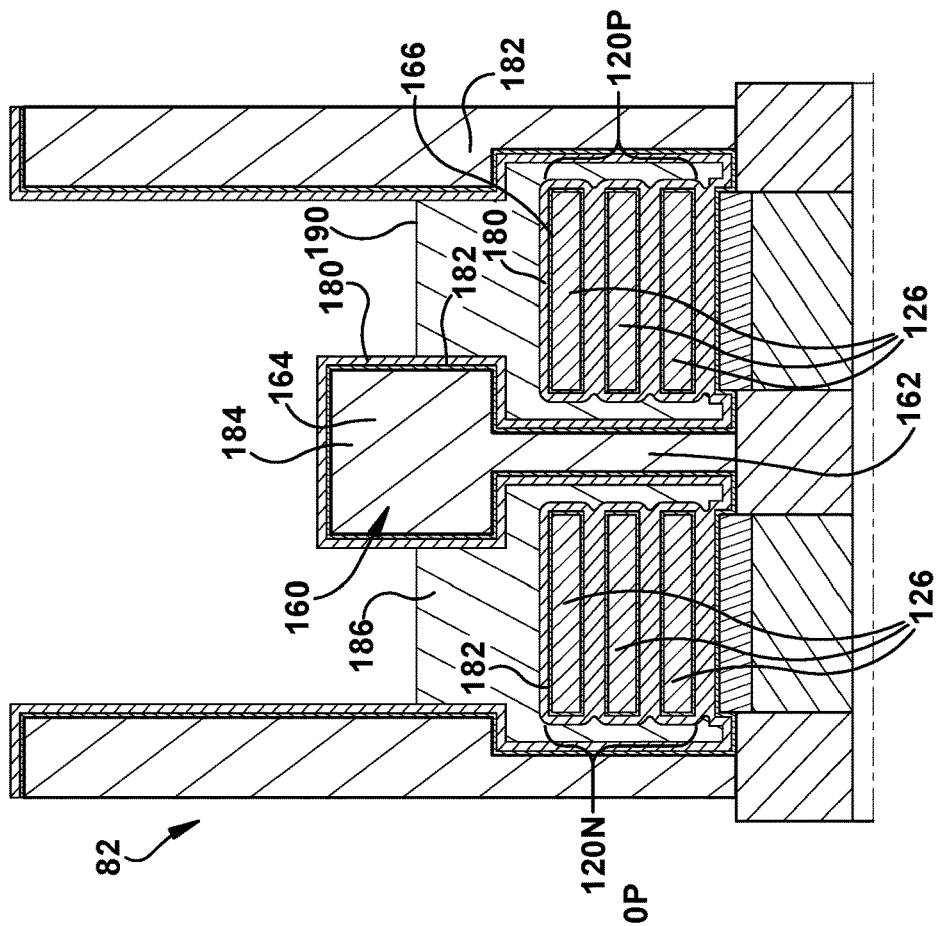
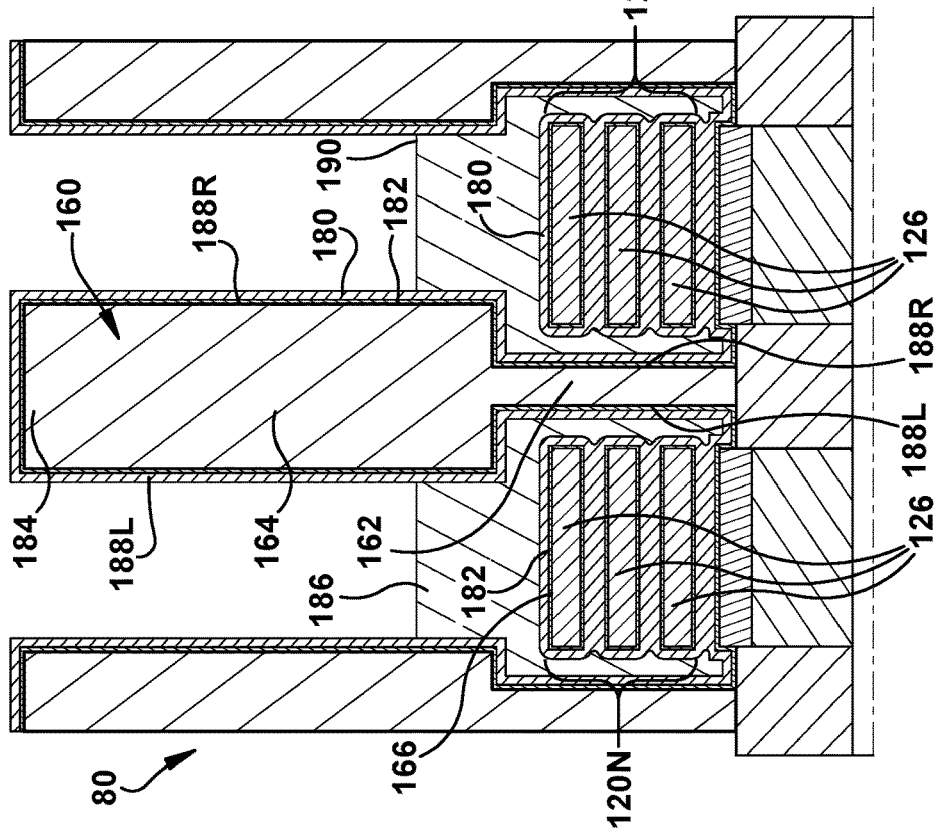

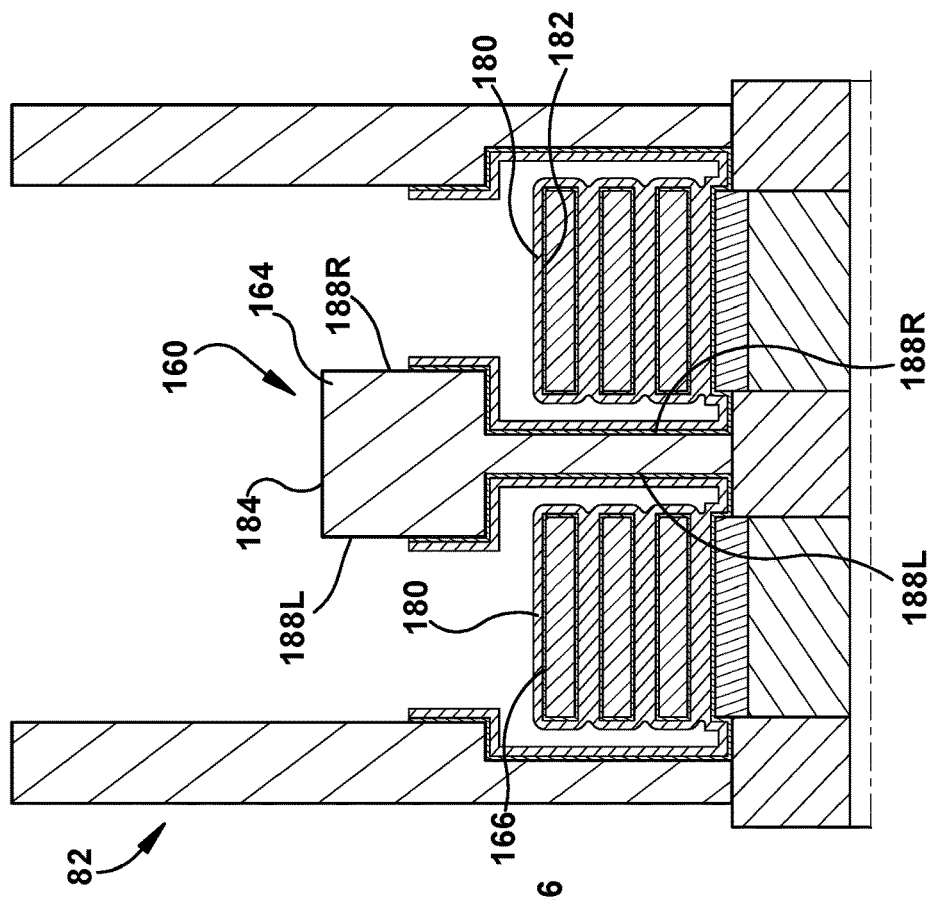
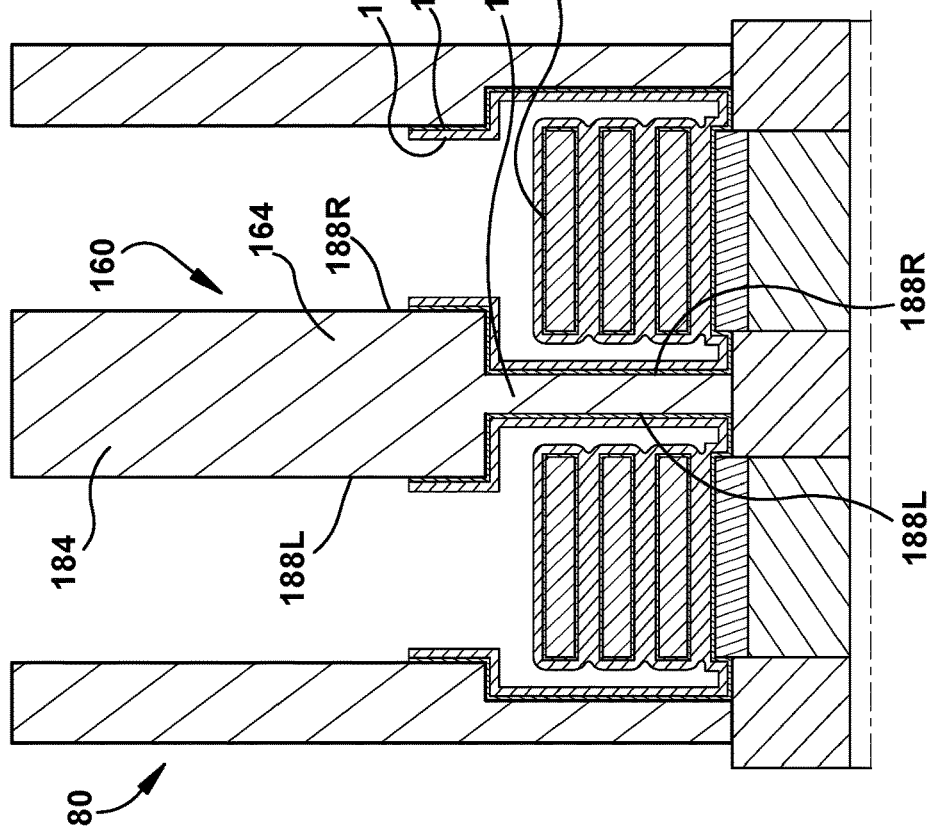

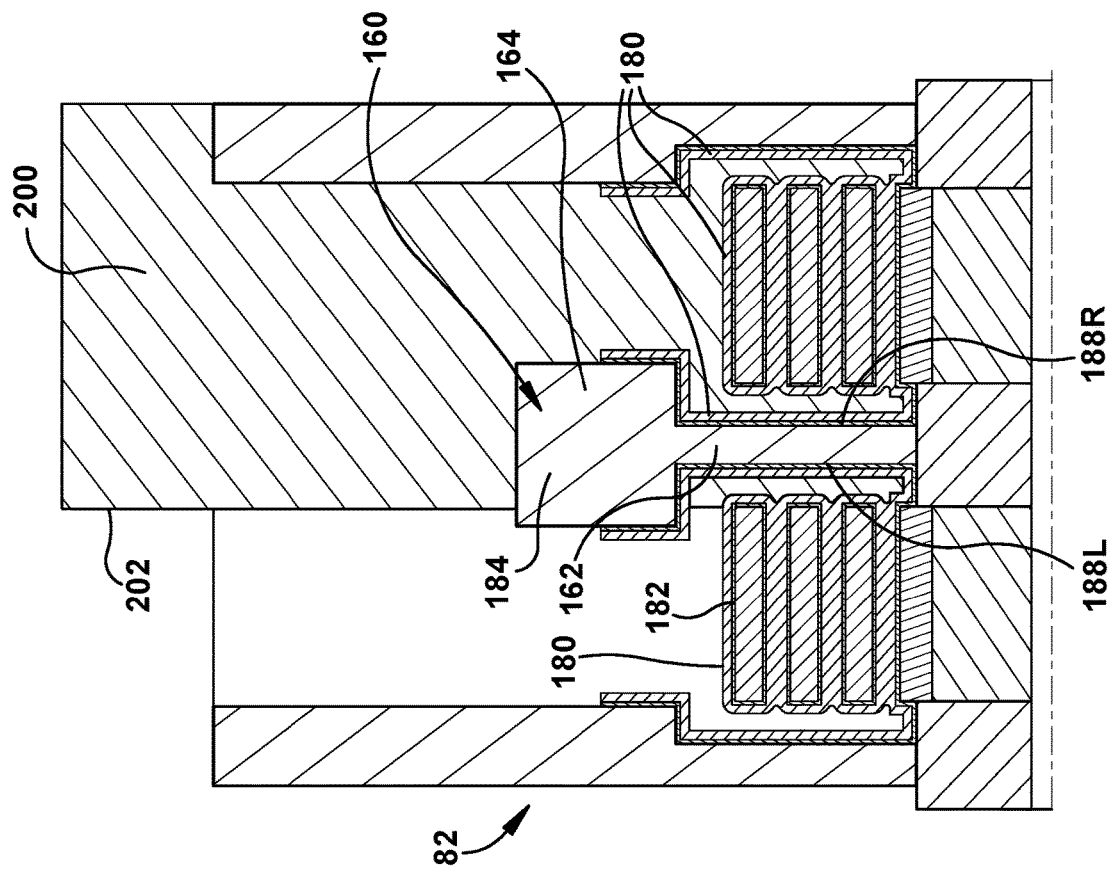
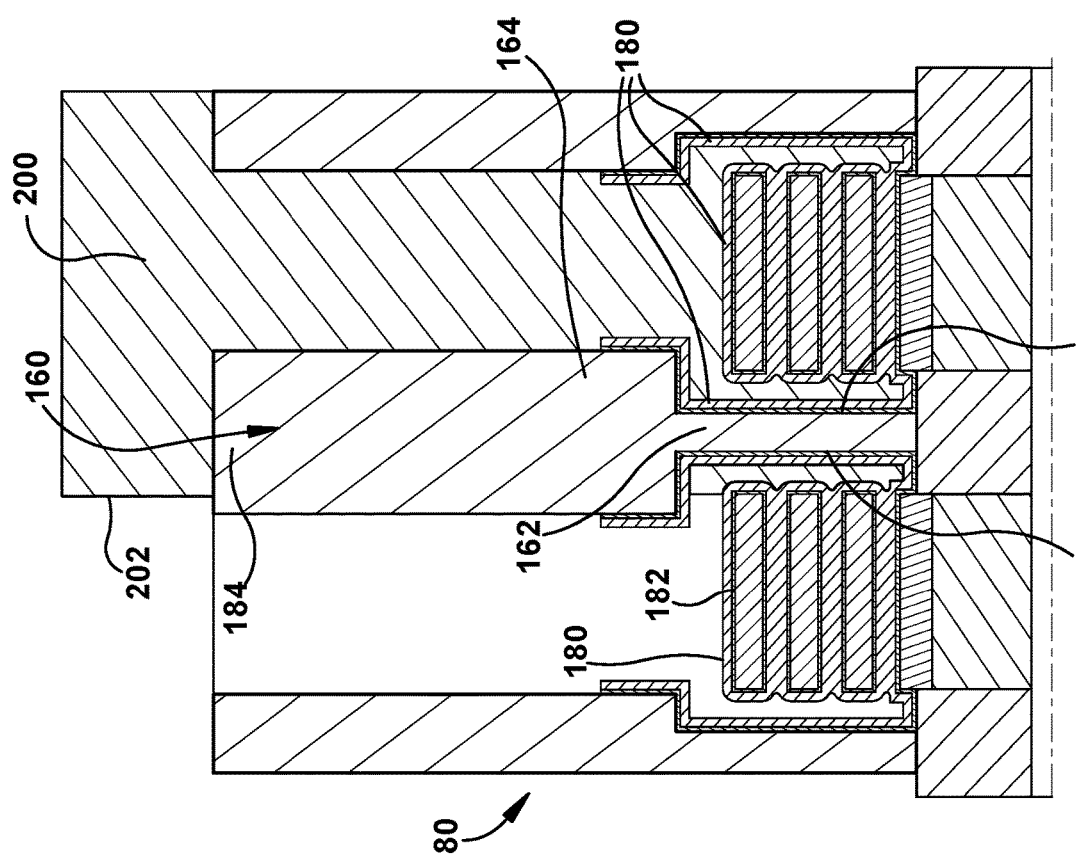

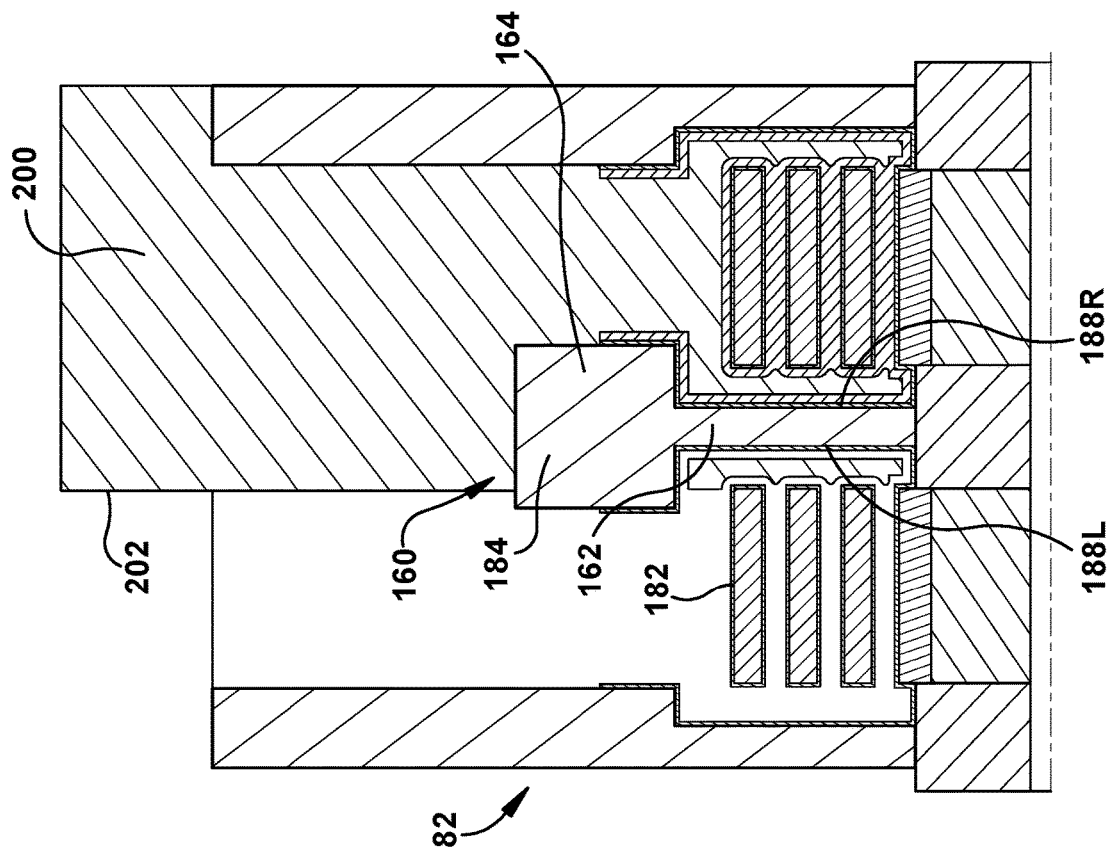
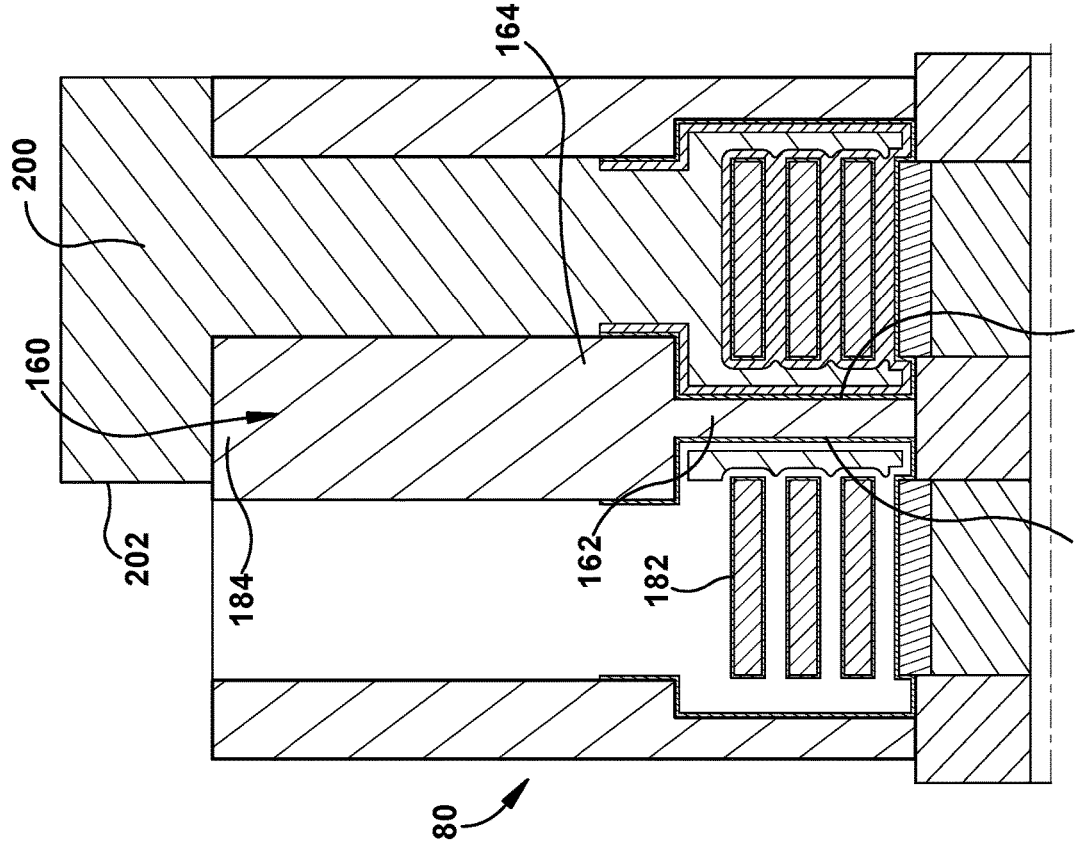

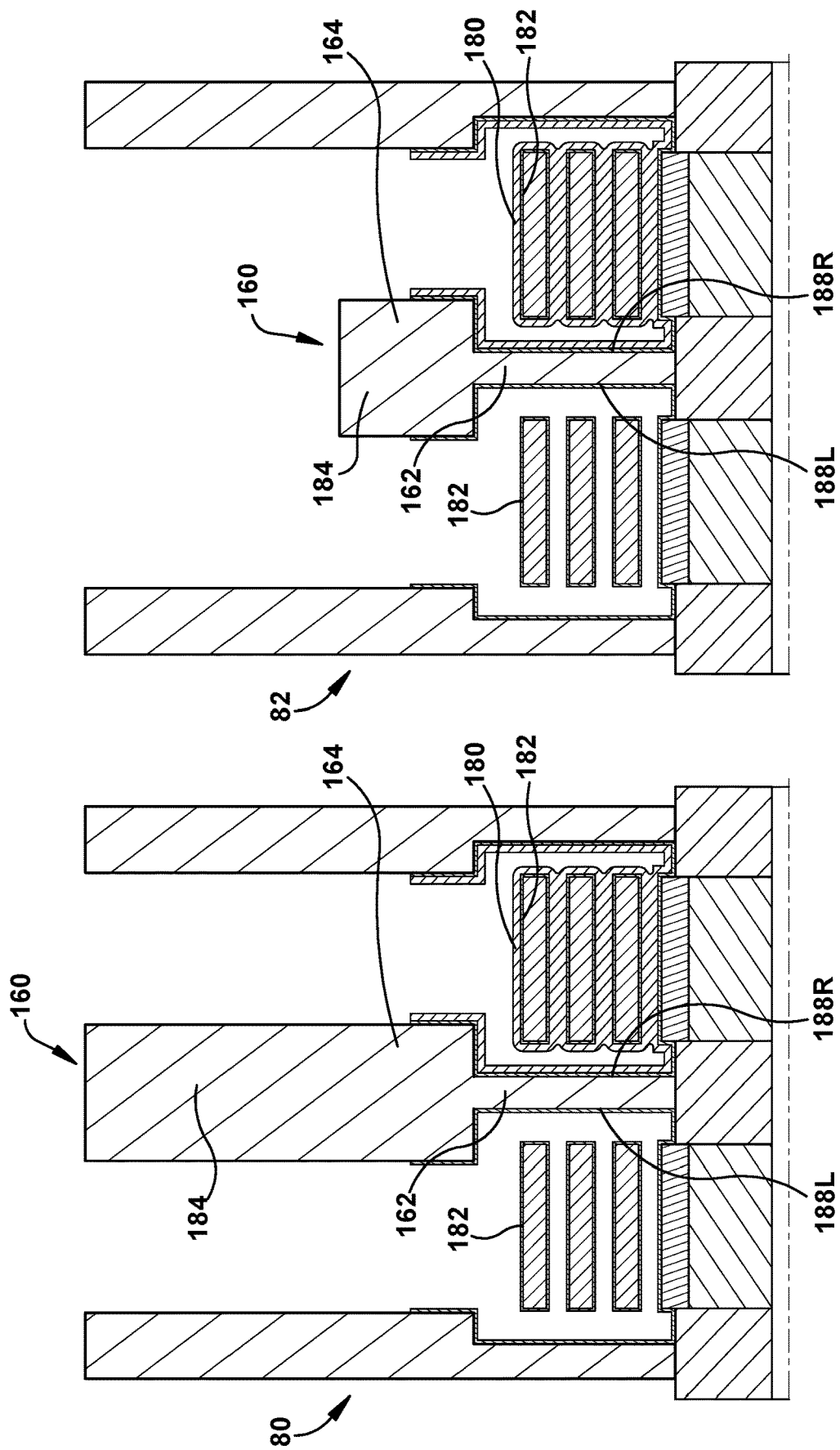

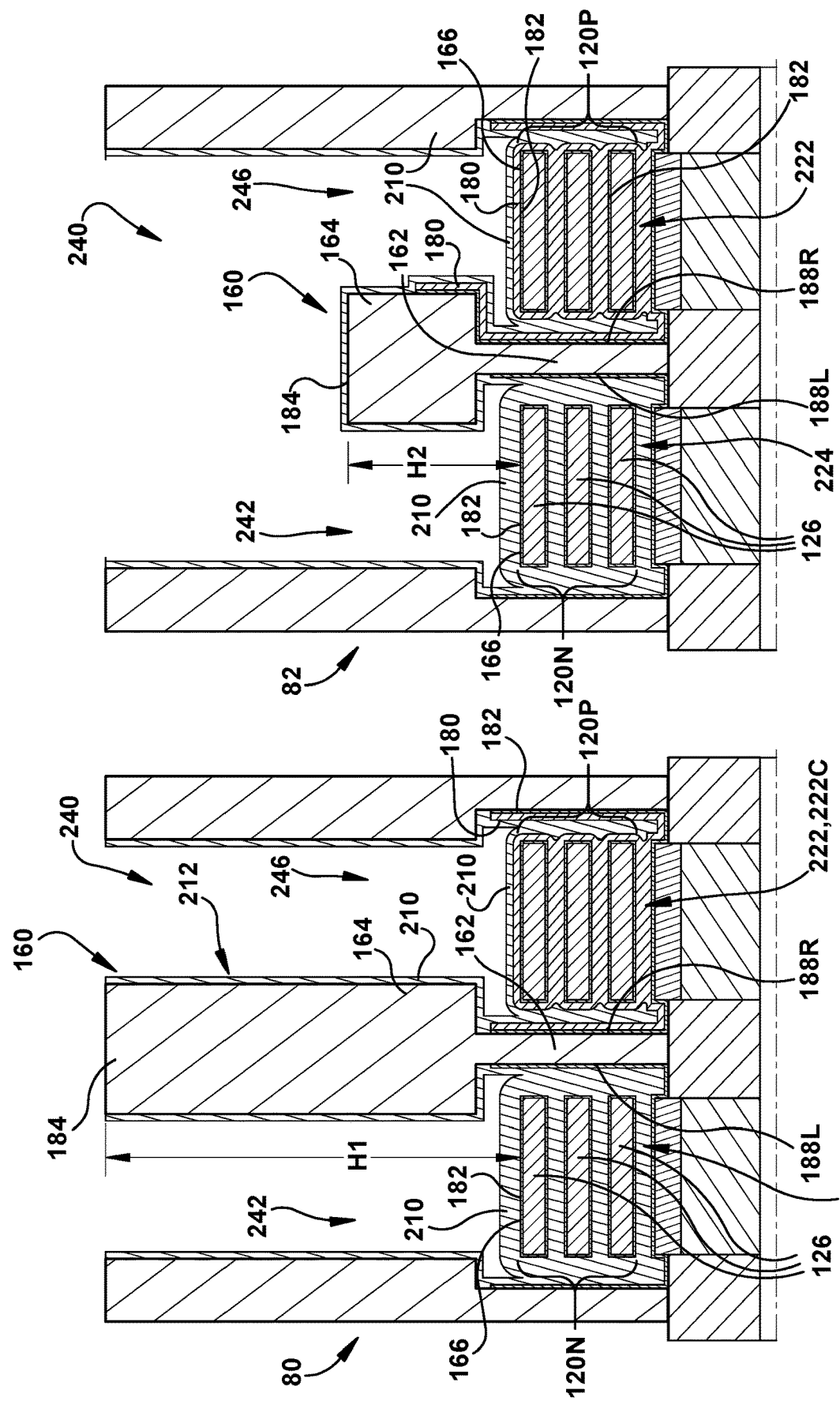

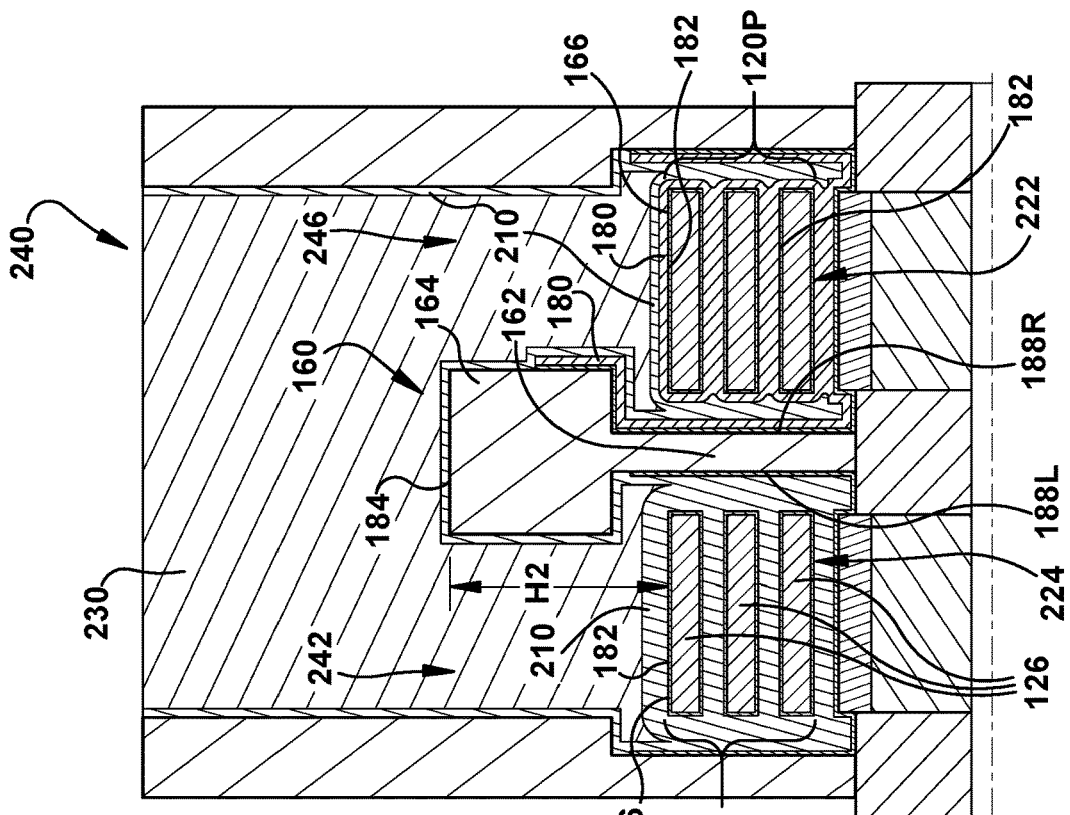
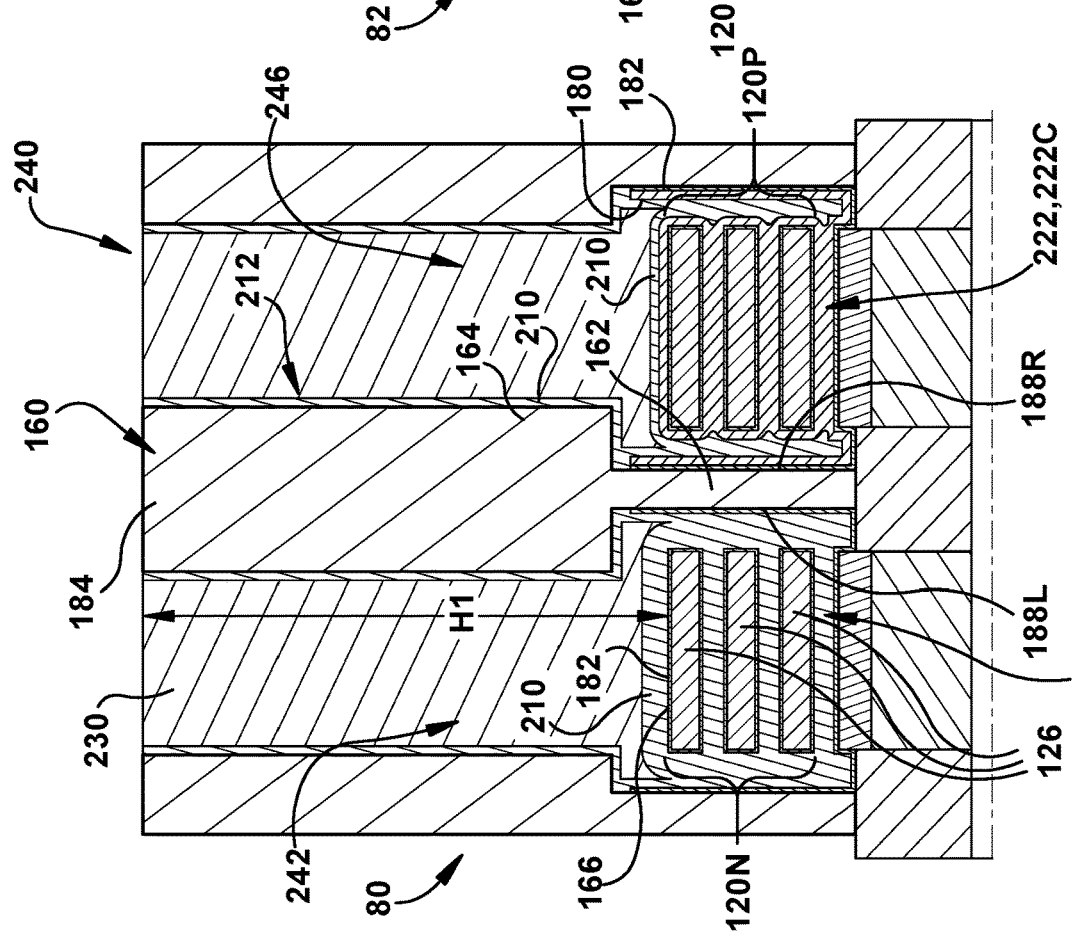

WORK FUNCTION METAL PATTERNING FOR N-P SPACES BETWEEN ACTIVE NANOSTRUCTURES USING UNITARY ISOLATION PILLAR

This application is related to U.S. application Ser. No. 16/047,043, entitled WORK FUNCTION METAL PATTERNING FOR N-P SPACES BETWEEN ACTIVE NANOSTRUCTURES, filed concurrently, and currently pending.

BACKGROUND

Technical Field

The present disclosure relates to integrated circuits, and more particularly to patterning work function metals for active nanostructure transistor devices with relatively small spaces between field effect transistors using a unitary isolation pillar.

Related Art

Field-effect transistors (FET) include doped source/drain regions that are formed in a semiconductor and separated by a channel region. A gate insulation layer is positioned about the channel region and a conductive gate electrode is positioned over or about the gate insulation layer. The gate insulation layer and the gate electrode together may be referred to as the gate stack for the device. By applying an appropriate voltage to the gate electrode, the channel region becomes conductive and current is allowed to flow from the source region to the drain region.

To improve the operating speed of the FETs, and to increase the density of FETs on an integrated circuit (IC), designs have gradually become smaller in size. Reductions to the size and the channel length in FETs can improve the switching speed of the FETs. A number of challenges arise as feature sizes of FETs and ICs get smaller. For example, significant downsizing of traditional FETs may produce electrostatic issues and mobility degradation. Scaled-down FETs may have shorter gate lengths that make it more difficult to control the channel. New device architectures such as "gate-all-around" active nanostructures allow further scaling of ICs, in part, because the gate is structured to wrap around the channel, creating more surface area and better control. This structure can provide better control with lower leakage current, faster operations, and lower output resistance. Active nanostructures used to form the channel can include a semiconductor nanowire, i.e., a vertically or horizontally oriented thin wire, or a plurality of stacked nanosheets, i.e., a plurality of vertically spaced semiconductor sheets.

In very small transistors such as nanostructure FETs, metal gates are used to provide high performance. The threshold voltage of a FET is the minimum voltage required to create the conducting path between the source and drain. Metal gates include a gate metal with a work function metal (WFM) and a layer having a high dielectric constant (high-k) in a combination known as high-k metal gate (HKMG). The work function metal is typically located between the high-k layer and the metal gate, and is used to tune the threshold voltage of the transistor. The work function is the minimum energy (usually measured in electron volts) needed to remove an electron from a solid to a point immediately outside the solid surface (or energy needed to move an electron from the Fermi energy level into vacuum), i.e., the final electron position is far from the surface on the atomic scale but still close to the solid on the macroscopic scale. Different transistors may require different threshold voltages, and therefore different work function metals. For example, a PFET (a FET with a channel that contains holes) may require a different work function metal than an NFET (a FET with a channel that contains electrons).

Some integrated circuits, known as bimetallic integrated circuits, include both NFETs and PFETs. These bimetallic integrated circuits may require at least two different work function metals, one for PFETs and one for NFETs. In some cases, an integrated circuit design may include a PFET directly adjacent to an NFET. In such a scenario, it may be difficult to deposit and pattern the different work function metals completely around the active nanostructure of the adjacent FETs without causing other problems.

SUMMARY

A first aspect of the disclosure provides a method comprising: forming a first active nanostructure on a substrate and a second active nanostructure on the substrate, the first and the second active nanostructures being adjacent to each other and separated by a first space; forming an isolation pillar between the first and second active nanostructures, the isolation pillar having a lower portion in a portion of the first space and an upper portion extending above an upper surface of the first and second active nanostructures, the upper portion and the lower portion being unitary; depositing a high dielectric constant (high-K) layer and a first metal over the first active nanostructure, the isolation pillar and the second active nanostructure; removing the first metal from a part of the isolation pillar, creating a discontinuity in the first metal separating the first metal over the first active nanostructure from the first metal over the second active nanostructure; and etching to remove the first metal surrounding the second active nanostructure, wherein the isolation pillar or the discontinuity in the first metal on the part of the isolation pillar prevent the etching from reaching and removing the first metal on the first active nanostructure; and depositing a second metal surrounding the second active nanostructure.

A second aspect includes a method comprising: forming a first active nanostructure on a substrate and a second active nanostructure on the substrate, the first and the second active nanostructures being adjacent to each other and separated by a first space; forming an isolation pillar between the first and second active nanostructures, the isolation pillar having a lower portion in a portion of the first space and an upper portion extending above an upper surface of the first and second active nanostructures, wherein the upper portion and the lower portion are unitary and the upper portion is wider than the lower portion, and wherein the upper portion extends to a first height above the upper surface of the first and second active nanostructures in a first gate region; in a gate region in which the first and second active nanostructures are to share a gate, etching the upper portion of the isolation pillar above the upper surface of the first and second active nanostructures to a second height that is less than the first height; depositing a high dielectric constant (high-K) layer and a first metal over the first active nanostructure, the isolation pillar and the second active nanostructure; removing the first metal from a part of the isolation pillar, creating a discontinuity in the first metal separating the first metal over the first active nano structure from the first metal over the second active nanostructure; etching to remove the first metal surrounding the second active nanostructure, wherein the isolation pillar or the discontinuity in the first metal on a part of the isolation pillar prevent the etching from reaching and removing the first metal on the first active nanostructure; and depositing a second metal surrounding the second active nanostructure.

A third aspect includes a field effect transistor (FET) structure, comprising: a first type field effect transistor (FET) having: a first active nanostructure on a substrate, a gate having a high dielectric constant (high-K) layer and a first work function metal (WFM) surrounding the first active nanostructure, and a source/drain (S/D) region at each of opposing ends of the first active nanostructure; a second type field effect transistor (FET) having: a second active nanostructure on the substrate adjacent to the first active nanostructure and separated by a space, the second FET further including a gate having the first WFM and a second work function metal (WFM) surrounding the second active nanostructure, and a source/drain (S/D) region at each of opposing ends of the second active nanostructure, the second WFM being different than the first WFM; and an isolation pillar including a lower portion positioned between the first and second active nanostructures in the space and a unitary, wider, upper portion extending above an upper surface of the first and second active nanostructures, wherein one of the first and second WFMs extends along a sidewall of the isolation pillar but not over a part of the isolation pillar.

BRIEF DESCRIPTION OF THE DRAWINGS

The embodiments of this disclosure will be described in detail, with reference to the following figures, wherein like designations denote like elements, and wherein:

FIG. 3 shows a cross-sectional view of active nanostructure formation, according to embodiments of the disclosure.

FIG. 4 shows a cross-sectional view of forming of a capping layer over active nanostructures, according to embodiments of the disclosure.

FIG. 5 shows a cross-sectional view of forming sacrificial columns over the capping layer, according to embodiments of the disclosure.

FIG. 6 shows a cross-sectional view of forming pillar material, according to embodiments of the disclosure.

FIGS. 8A-B show cross-sectional views of forming an isolation pillar in a first and second gate region along view lines A-A and B-B in FIG. 1, respectively, according to embodiments of the disclosure.

FIGS. 9A-B show cross-sectional views of removing sacrificial columns in the first and second gate regions along view lines A-A and B-B in FIG. 1, respectively, according to embodiments of the disclosure.

FIGS. 10A-B show cross-sectional views of removing a capping layer and a nanosheet release process in the first and second gate regions along view lines A-A and B-B in FIG. 1, respectively, according to embodiments of the disclosure.

FIGS. 12A-B show cross-sectional views of a high dielectric constant (high-K) layer and first work function metal (WFM) formation in the first and second gate regions along view lines A-A and B-B in FIG. 1, respectively, according to embodiments of the disclosure.

FIGS. 13A-B show cross-sectional views of removing the first WFM to expose at least a portion of the isolation pillar in the first and second gate regions along view lines A-A and B-B in FIG. 1, respectively, according to embodiments of the disclosure.

FIGS. 15A-B show cross-sectional views of removal of the protective layer for removing the first WFM from the part of the isolation pillar in the first and second gate regions along view lines A-A and B-B in FIG. 1, respectively, according to embodiments of the disclosure.

FIGS. 16A-B show cross-sectional views prior to removing the first WFM from an active nanostructure in the first and second gate regions along view lines A-A and B-B in FIG. 1, respectively, according to embodiments of the disclosure.

FIGS. 17A-B show cross-sectional views of removing the first WFM from the active nanostructure in the first and second gate regions along view lines A-A and B-B in FIG. 1, respectively, according to embodiments of the disclosure.

FIGS. 18A-B show cross-sectional views of removal of the mask for removing the first WFM in the first and second gate regions along view lines A-A and B-B in FIG. 1, respectively, according to embodiments of the disclosure.

FIGS. 19A-B show cross-sectional views of formation of a second WFM and a gate metal layer in the first and second gate regions along view lines A-A and B-B in FIG. 1, respectively, according to embodiments of the disclosure. FIGS. 19A-B also show an embodiment of a FET structure along view lines A-A and B-B in FIG. 1, respectively, according to embodiments of the disclosure.

FIGS. 20A-B show cross-sectional views of optional formation of a metal gate layer in the first and second gate regions along view lines A-A and B-B in FIG. 1, respectively, according to embodiments of the disclosure. FIGS. 20A-B also show another embodiment of a FET structure along view lines A-A and B-B in FIG. 1, respectively, according to embodiments of the disclosure.

Figure 1:
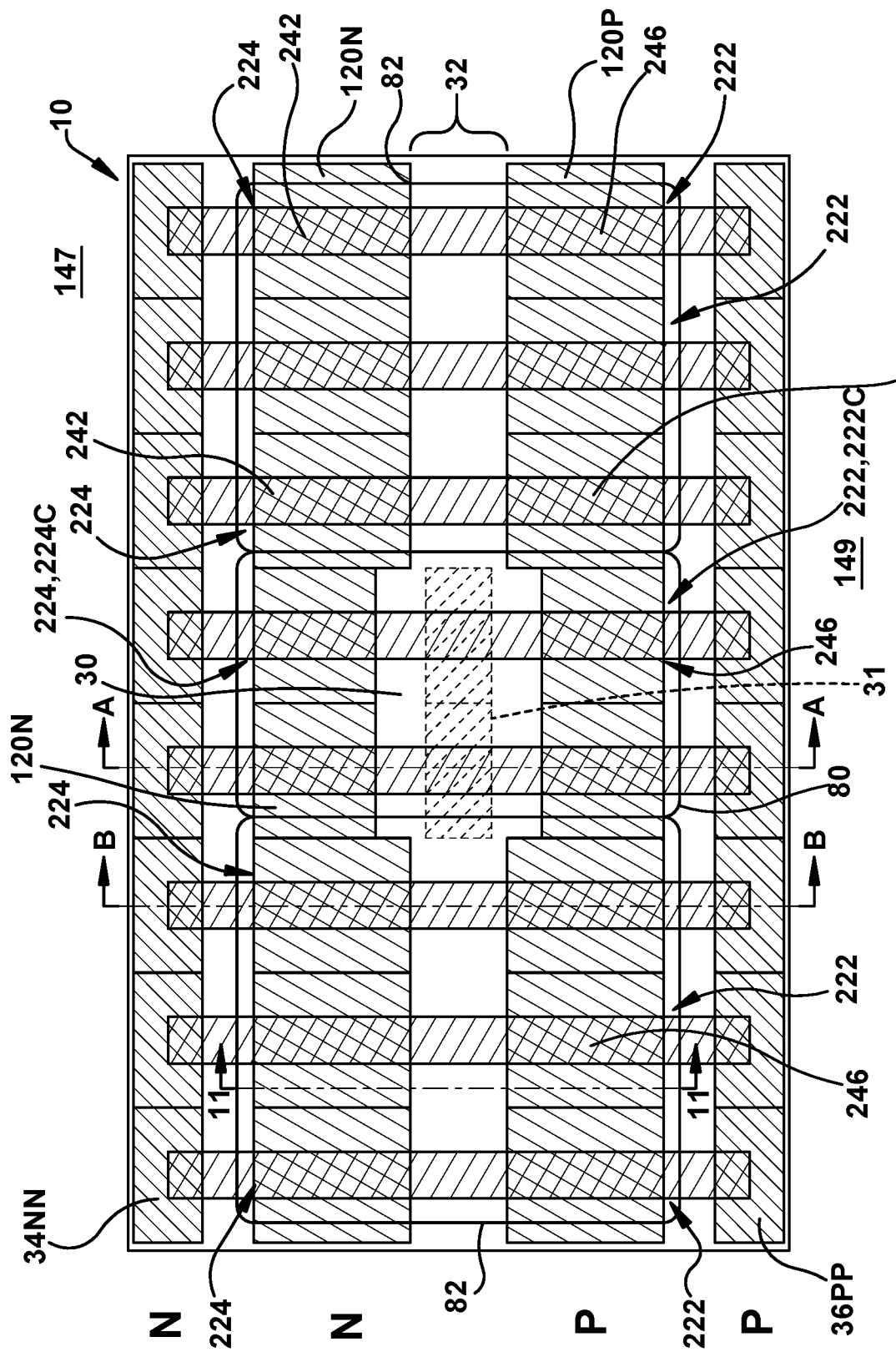
FIG. 1 shows a plan view of an IC layout according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure provide methods for work function metal (WFM) patterning for active nanostructure transistor devices that may be used in integrated circuits (IC). In some embodiments, an isolation pillar can reduce or eliminate an overetch formed during removal of a WFM such that the overetch does not expose the WFM on the adjacent active nanostructure. The resulting IC may include different WFMs on adjacent active nanostructures, creating different types of FETs. The isolation pillar may have a lower section between active nanostructures of adjacent FETs and a wider, unitary upper section above an upper surface of the active nanostructures. The isolation pillar may have a first height above the upper surface of active nanostructures in a first gate region where the gates of adjacent FETs are to be electrically isolated, and a second height that is less than the first height in a second gate region where the gates of adjacent FETs are to be electrically connected.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

As noted, bimetallic ICs include both NFETs and PFETs. These bimetallic ICs may use at least two different WFMs, one for PFETs and one for NFETs. In cases where an IC includes a PFET directly adjacent to an NFET, it may be difficult to deposit and pattern the different WFMs completely around the active nanostructure of the adjacent FETs without causing other problems. For example, within an opening created by removal of a dummy gate, a first WFM is applied to both FETs. However, the first WFM must be removed from the active nanostructure that requires a second, different WFM. Conventionally, a mask is formed in the dummy gate opening over a first active nanostructure, but not over an exposed second active nanostructure from which the first WFM must be removed. Isotropic wet etching is used to remove the first WFM from between the active nanostructure, e.g., nanosheets, fin or nanowire, of the exposed second active nanostructure that requires the second WFM. However, due to the small amount of space between the active nanostructures, the wet etching will follow the layer of the first WFM to the masked first active nanostructure. In particular, the wet etching may create a path to, or at least toward, the adjacent masked first active nanostructure, i.e., the etching overetches or sneaks around the mask. The overetch path may include an undercut under the mask layer, and/or a vertically extending path about the mask layer where ends thereof meet the first WFM in the dummy gate opening.

Conventionally, the spacing between adjacent nanostructures is sufficient to prevent the overetching from reaching the masked, first active nanostructure, and posing a problem. However, as the distance between adjacent nanostructures has decreased (e.g., to less than 45 nanometers (nm) not including work function metal layer thickness), it has been discovered that the overetching may extend far enough to expose the first WFM of the masked, first active nanostructure. In some cases, the overetching can remove or damage the first WFM about the masked, first active nanostructure (removing it from at least a side portion of the nanowire, fin or nanosheets thereof, and/or even from between nanosheets, where provided). In any event, the overetching may render the device inoperable.

The necessary duration of the wet etching can also impact the extent of overetching. For example, the overetching issue may be magnified relative to nanosheet stack applications because the wet etch must be allowed to act for a sufficient amount of time to remove the first WFM from not just around the active nanostructure, but also between the nanosheets of the exposed, second active nanostructure. The wet etch duration being longer in this setting, compared to a nanowire application, allows more time for the wet etch to work around the mask to remove the first WFM from the masked, first active nanostructure. In some cases, the duration may be sufficient for the wet etch to remove the first WFM from the first nanosheet stack even though it is covered by the mask. In another example, the width of nanostructures within a single IC may vary over a large scale for different devices. For example, a device for a static random access memory (SRAM) may have a nanostructure having a width of about 5 to 40 nm, but those for logic devices on the same IC may have a width of about 20 to 80 nm. The wet etch must have a duration to address the highest width active nanostructure (e.g., 80 nm) even though devices having a smaller width nanostructure that do not require such a long duration, are present. Consequently, the smaller width nanostructure devices are highly likely to experience overetching. As will be described, embodiments of the disclosure employ an isolation pillar to prevent the overetch from reaching the masked active nanostructure.

Another challenge with WFM patterning is addressing mask edge placement error (EPE). More particularly, the edge of the mask for WFM patterning is ideally placed between the adjacent active nanostructures, leaving the first WFM over the masked, first active nanostructure after the etching. Conventionally, such mask edge placement is not an issue because the space provides sufficient tolerance to statistically accommodate some misalignment. However, as the distance between adjacent active nanostructures is decreased, the ability to properly place an edge of the mask between adjacent nanosheet stacks, fins or nanowires is significantly impaired. For example, for the next generation of devices (e.g., 7 nm), the space between active nanostructures is at or less than 45 nm, considering the high-K layer and the first WFM on both active nanostructures, the space left to land the mask edge becomes too small to reliably ensure the mask edge lands properly. Due to current mask edge alignment variations, the mask edge can be either on top of or too close to one or the other nanostructure, i.e., nanosheet stack, fin or nanowire. If the mask edge is on top of the first active nanostructure, the wet etch may remove at least part of the first WFM from an unmasked portion of the first active nanostructure, rendering the first device inoperable. If the mask edge is on top of the second active nanostructure, the wet etch cannot properly remove the first WFM from the second active nanostructure, possibly rendering the second device inoperable. If the mask is too close to either nanostructure, it increases the likelihood of mask undercut, and its resulting structural issues. As will be described, the isolation pillar according to embodiments of the disclosure addresses this challenge by relaxing the precision required to land the mask edge.

Referring to the drawings, a method according to embodiments of the disclosure will be described.

FIG. 1 shows a plan view of an IC layout 10 according to embodiments of the disclosure. FIG. 1 shows IC layout 10 with a FET structure completed, but FIG. 1 will also be referenced for purposes of description of the steps of the method according to embodiments of the disclosure. As shown in FIG. 1, IC layout 10 includes a plurality of p-type active nanostructures 120P for p-type field effect transistors (PFETs) 222, i.e., where gates 246 extend over active nanostructures 120P. IC layout 10 also includes a plurality of n-type active nanostructures 120N for n-type field effect transistors (NFETs) 224, i.e., where gates 242 extend over active nanostructures 120N. For purposes of description, FIG. 1 also shows a gate cut landing area 30 for an intended gate cut isolation 31 (not actually built, shown in phantom) between adjacent P and N type active nanostructures 120P and 120N. Gate cut landing area 30 would conventionally be defined between adjacent PFETs 222 and NFETs 224 in an N-P space 32 therebetween. (Gate cut isolations 34NN and 36PP isolate adjacent NFETs (upper end of view) and adjacent PFETs, respectively (lower end of view) (FETs not shown)). As understood by one skilled in the art, a conventional gate cut isolation is typically formed after forming a dummy gate (not shown), e.g., by forming an opening in the dummy gate between active nanostructures to a substrate therebelow, and filling the opening with an insulator that remains in place after dummy gate removal.

IC layout 10 has a first gate region 80 (one shown, in center) in which gates of adjacent NFETs 224 and PFETs 222 are electrically isolated, and a second gate region 82 (two shown) in which gates of adjacent NFETs 224 and PFETs 222 are electrically connected or shared. First gate region 80 would typically require a gate cut isolation 31 (phantom box) in a gate cut landing area 30. However, where a gate cut isolation 31 (phantom box) is desired between certain parts of PFET 222C and NFET 224C, gate cut landing area 30, i.e., space between PFET 222C and NFET 224C, may not provide sufficient width to land a gate cut isolation using current processes. In order to address this situation, as shown in the middle of FIG. 1, current practice is to reduce the width of active nanostructures 120P, 120N and the respective NFET 224C and PFET 222C, where necessary, to enlarge the spacing therebetween and create a larger gate cut isolation landing area 30. Unfortunately, as shown, this process requires formation of tapered NFET 224C and PFET 222C devices (e.g., with jogs and corners) that are hard to manufacture due to, e.g., nanostructure variability, proximity issues, lithography and patterning limits, etc. Further, the reduction in width of the active nanostructures is typically accompanied by a reduction in performance of the FETs. Embodiments of the disclosure provide processes for forming an isolation pillar 160 that includes an upper portion 164 that acts as a gate cut isolation 212 (FIGS. 19A, 20A) in first gate region 80, without having to re-shape active nanostructures. Further, embodiments of the disclosure reduce at least part of upper portion 164 in second gate region 82 (FIGS. 19B, 20B), allowing gates 242, 246 of adjacent NFETs 224 and PFETs 222 to be electrically connected or shared, where desired.

As will be described, processing in each gate region 80, 82 may vary. For purposes of description, those figures labeled with just a number show common structure and processing for both gate regions 80, 82; those figures labeled with a number and an 'A' show cross-sectional views along view line A-A in FIG. 1 through first gate region 80 (gates isolated); and those figures with a corresponding number and a 'B' show cross-sectional views along view line B-B through second gate region 82 (gates connected/shared).

Figure 2:
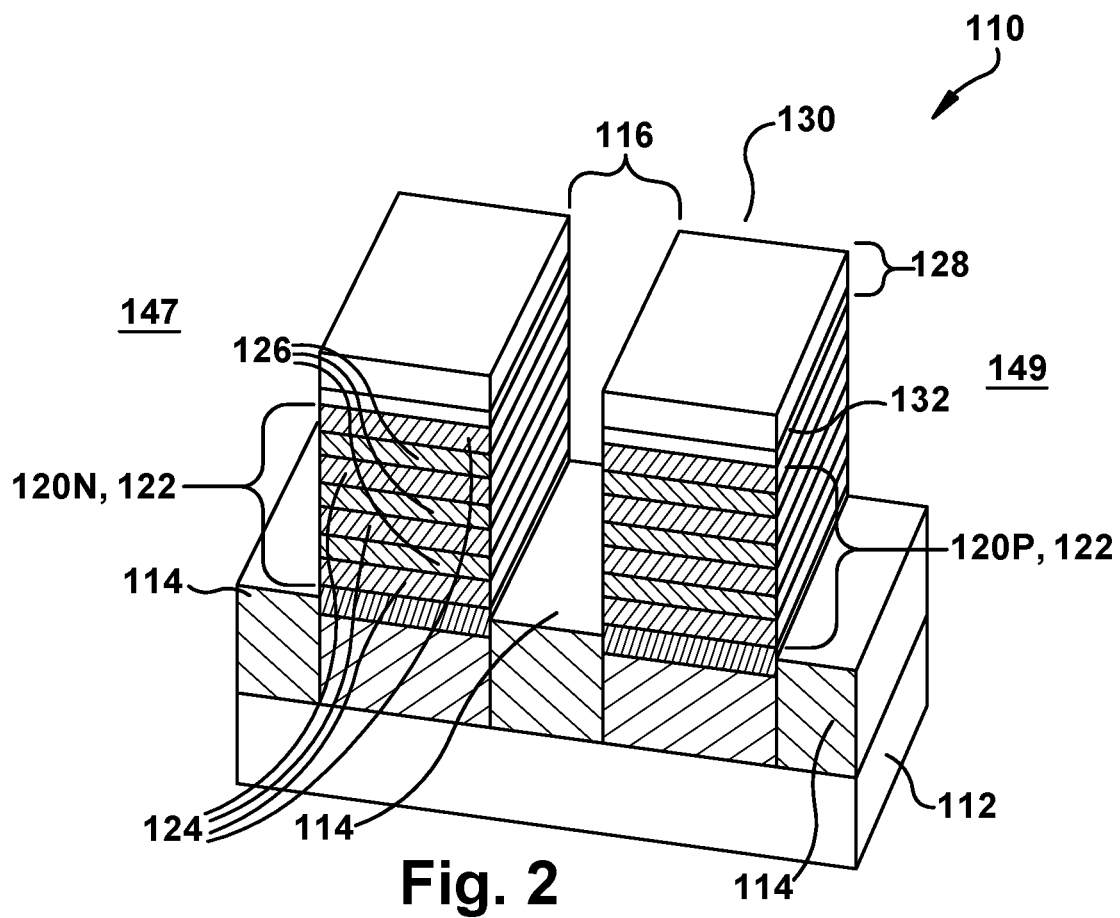
FIG. 2 shows a perspective cross-sectional view of active nanostructure formation, according to embodiments of the disclosure.

FIG. 2 shows a perspective cross-sectional view of a precursor structure 110. Precursor structure 110 may include a substrate 112 which may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Substrate 112 may also take the form of a semiconductor-on-insulator (SOI) substrate, including an SOI layer over a buried insulator layer (not shown) over a bulk semiconductor layer. The buried insulator layer may include, for example, silicon oxide, and the semiconductor layers may include any semiconductor material listed herein.

FIG. 2 also shows a plurality of shallow trench isolations (STIs) 114 separating active nanostructures 120N and 120P. Each STI 114 may include a trench etched into substrate 112 filled with an insulator, or an insulator deposited on top of substrate 112. STIs 114 isolate one region of the substrate from an adjacent region of the substrate. As understood, one or more transistors of a given polarity may be disposed within an area isolated by STI 114. Each STI 114 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

FIG. 2 also shows forming a first active nanostructure 120P on substrate 112 and a second active nanostructure 120N on substrate 112. This step may occur before or after STI 114 formation. Active nanostructures 120N, 120P may be formed using any now known or later developed lithography process. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A photoresist developer is then used to remove the more soluble areas of the resist leaving a patterned resist. The patterned resist can then serve as a mask for the underlying layers which can then be selectively treated, such as to receive dopants and/or to undergo etching, for example. Here, the nanostructures are etched to form their final shape. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

After forming, first and the second active nanostructures 120P, 120N are adjacent to each other on substrate 112 and separated by a first space 116. First space 116 may be less than 45 nanometers (nm). As used herein, "active nanostructure" may include any form of vertically oriented semiconductor structure for providing a channel of a transistor device, e.g., one capable of a gate all around arrangement. As illustrated, active nanostructures 120N, 120P may include nanosheet stacks 122. Here, forming first and second active nanostructures 120P, 120N may include forming respective first and second nanosheet stacks 122. Each nanosheet stack 122 may include nanosheets 126 separated (alternatingly) by sacrificial layers 124. Nanosheets 126 may include a semiconductor, e.g., silicon, and sacrificial layers 124 may include any of a variety of sacrificial materials, such as silicon germanium. Other materials for nanosheets and/or sacrificial layers are possible. Nanosheet stacks 122 may include at least one nanosheet 126. In one embodiment, each nanosheet stack 122 includes three nanosheets 126, as shown in FIG. 2. Nanosheet stacks 122 may be formed by alternating deposition of sacrificial layers 124 and nanosheet 126 layers, followed by photolithographic patterning using a mask 128 including a hard mask 130, e.g., of silicon nitride, and a pad oxide 132.

Continuing with FIG. 2, mask 128 may be shaped to form a first space 116 between active nanostructures 120N, 120P. First space 116 may have a different width between pairs of adjacent NFETs and PFETs (N-P spacing), adjacent NFETs and/or adjacent PFETs. For example, the N-P spacing may be smaller than the others such that, as will be described, only one isolation pillar is formed in an N-P space, but two are formed in N-N or P-P space—one on each active nanostructure. Active nanostructures 120N, 120P may be etched to their shapes shown using any appropriate etching process. Once active nanostructures 120N, 120P are shaped, mask 128 may be removed, e.g., using any appropriate ashing process to remove mask 128.

FIG. 3 shows a cross-sectional view of first and second active nanostructures 120N, 120P with first space 116 therebetween after removal of mask 128 and other structures, such as amorphous silicon dummy gate (not shown) and dummy gate oxide (not shown). It is understood that FIG. 3 shows a cross-section in a gate cavity opening for gate regions 80, 82 (FIG. 1).

While active nanostructures 120N, 120P will be described herein as nanosheet stacks 122, it is understood that they can take a variety of alternative forms including but not limited to: semiconductor fins, semiconductor nanowires, etc. As will be apparent to those skilled in the art, the teachings of the disclosure are applicable to any variety of nanostructure. It is understood that active nanostructures 120N, 120P will generally be surrounded by an interlayer dielectric (ILD) later in the process sequence, after a dummy gate and source and drain regions are formed. The ILD may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

FIGS. 4-10B show cross-sectional views of a process of forming an isolation pillar 160 (FIGS. 10A-B) between first and second active nanostructures 120P, 120N. As shown in FIGS. 10A-B, and as will be described, isolation pillar 160 has a lower portion 162 in a portion 144 of first space 116 and an upper portion 164 extending above an upper surface 166 of first and second active nanostructures 120P, 120N. Upper portion 164 and lower portion 162 are unitary, i.e., there is no seam between the portions and they are formed as one, integral structure. The teachings of the disclosure will be described relative to isolation pillar 160 between first and second nanostructures 120N, 120P for an NFET and PFET, i.e., for N-P space, but one or more isolation pillars 160 may be formed in spaces between same types of FETs. That is, isolation pillar(s) 160 may be formed between all adjacent active nanostructures on the substrate, e.g., as shown in FIGS. 1, 3 and 4, in N-N space 147 and P-P space 149 (adjacent active nanostructures removed for clarity).

As shown in the cross-sectional view of FIG. 4, the process may include forming a capping layer 142 over first and second active nanostructure 120P, 120N such that a portion 144 of first space 116 remains open thereafter. This step may include epitaxially growing capping layer 142 from sacrificial layers 124 of nanosheet stacks 122. Capping layer 142 may include, for example, silicon germanium, but could include other selectively grown material over the nanosheet stacks, e.g., metal, dielectric, etc. As will be described, a thickness of capping layer 142 above active nanostructures 120N, 120P determines a height of lower portion 164 of isolation pillar 160 above the active nano structures. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface.

FIG. 5 shows a cross-sectional view of forming a sacrificial column 150 above each of first and second active nanostructures 120P, 120N, creating a second space 152 between sacrificial columns 150. Second space 152 is contiguous with portion 144 of first space 116. For purposes that will be described herein, second space 152 is wider than portion 144 of first space 116. Sacrificial columns 150 may be formed using any now known or later developed technique. In one example, sacrificial material such as an organic planarization layer (OPL) may be deposited and etched using a mask 154 to form sacrificial columns 150. Mask 154 may be a negative tone mask, i.e., a mask typically used to form gate cut openings in gate cut landing area 30 (FIG. 1). Mask 154 may include any appropriate hard mask material, e.g., silicon nitride. The etch used may be any appropriate etching chemistry for the OPL used, e.g., a RIE. Sacrificial columns 150 land on top of capping layer 142 over first and second active nanostructures 120P, 120N. Sacrificial column 150 alignment with capping layer 142 and first and second active nanostructures 120P, 120N does not need to be exact, i.e., sacrificial column 150 edge placement over capping layer 142 and first and second active nanostructures 120P, 120N is not critical (e.g., it only has to expose N-P, N-N and P-P spaces). Once sacrificial columns 150 are formed, mask 154 may be removed, e.g., using an ashing process appropriate for the mask material.

FIG. 6 shows a cross-sectional view of forming a pillar material 158 in portion 144 of first space 116 and in second space 152. This process may include depositing pillar material 158, e.g., using CVD. Pillar material 158 may include but is not limited to: silicon oxycarbide (SiOC), silicon oxide, silicon oxy-carbide nitride (SiOCN), silicon nitride (SiN) or silicon boron carbon nitride (SiBCN). Pillar material 158 fills portion 144 of first space 116 that has less width than second space 152 such that pillar material 158 in second space 152 extends over and above upper surface 166 of first and active nanostructure 120N, 120P. Note also, pillar material 158 is between active nanostructures 120N, 120P (in middle of drawing) but also extends around each nanosheet stack 122.

FIGS. 7, 8A, 8B, 9A, 9B, 10A and 10B, show cross-sectional views of removing sacrificial columns 150 and capping layer 142, creating lower portion 162 of isolation pillar 160 from pillar material 158 (FIG. 7) in portion 144 of first space 116 between first and second active nanostructures 120P, 120N, and creating upper portion 164 of isolation pillar 160 extending above upper surface 166 of first and second active nanostructures 120P, 120N. Once complete, as shown in FIGS. 9A and 9B, upper portion 164 extends over upper surface 166 and upper portion 164 extends upwardly above first and second active nanostructures 120P, 120N. A thickness of capping layer 142 (FIG. 6) above active nanostructures 120N, 120P determines a height of lower portion 164 of isolation pillar 160 above the active nanostructures 120P, 120N. Since capping layer 142 (FIG. 6) is relatively thin, lower portion 164 is relatively close to active nanostructures 120P, 120N. Since second space 152 is wider than portion 144 of first space 116, upper portion 164 is wider than lower portion 162. Since pillar material 158 is deposited all at once, upper portion 164 and lower portion 162 are unitary, i.e., there is no seam between the portions and they are formed as one, integral structure.

Figure 7:
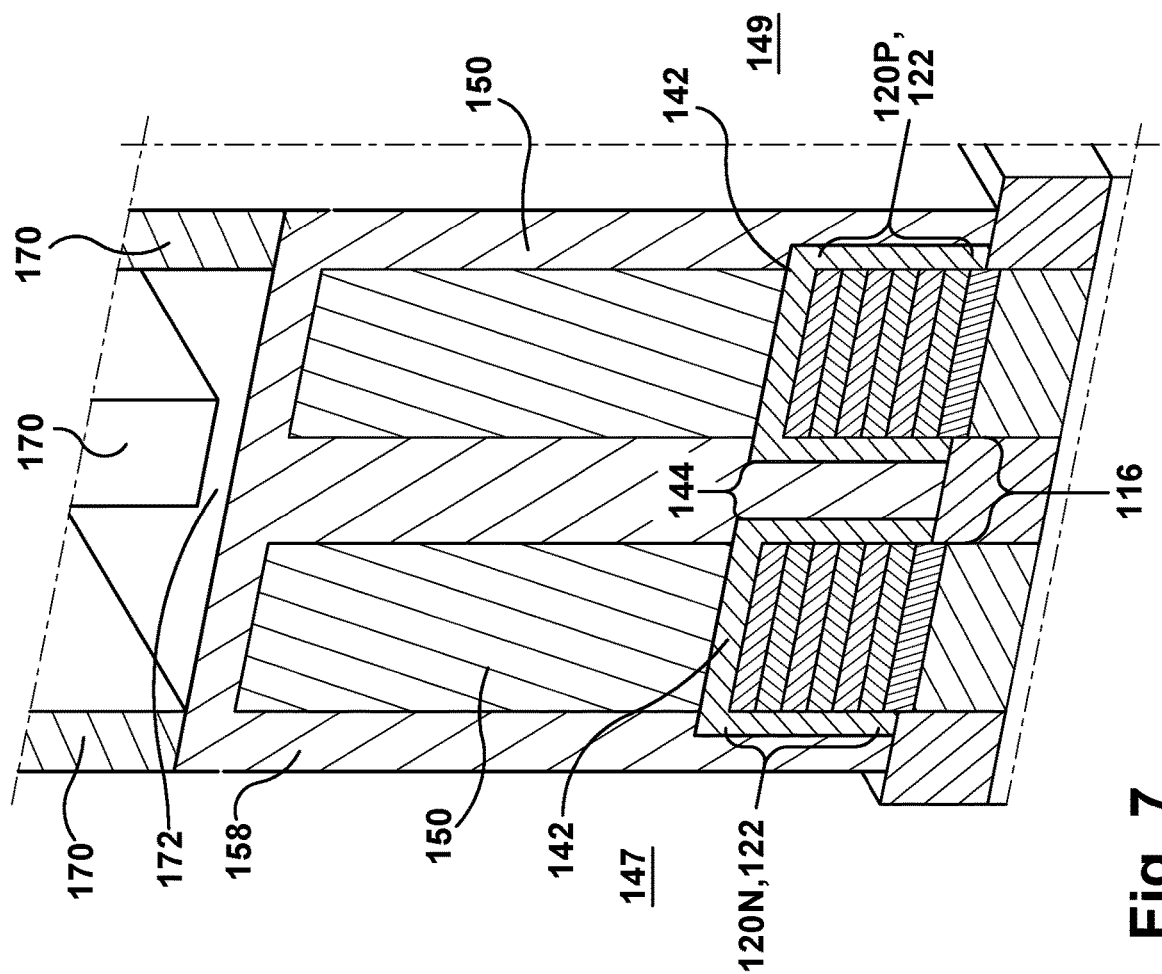
FIG. 7 shows a cross-sectional view of forming a mask for forming an isolation pillar, according to embodiments of the disclosure.

FIG. 7 shows forming a mask 170 for reducing a height of isolation pillar 160 (FIGS. 8A-B) in second gate region 82. Mask 170 may be an inverse mask for that used for gate cut isolations 31 (shown in phantom in gate cut landing area 30 (FIG. 1)). The inverse mask can be formed using a negative tone photoresist (i.e., a photoresist in which portions exposed to light become insoluble to the photoresist developer, and the unexposed portion is dissolved in the photoresist developer) on the material with the same intervening mask or template containing the pattern for the gate cut isolations. Hence, mask 170 creates openings for etching in areas in the pattern that would be protected (not etched) areas on a positive tone mask, i.e., it is the inversion of the typically employed positive tone mask for gate cut isolations. Thus, mask 170 creates openings for etching everywhere except where a gate cut isolation opening 31 (in phantom in FIG. 1) would normally be created. In this fashion, over second gate region 82, where a gate cut isolation would normally not be present and where isolation pillar 160 separation of gates is not desired, an opening 172 is formed in mask 170. Opening 172 allows for reduction in height of pillar 160 to allow for later gate connection.

In contrast, mask 170 covers first gate region 80 where gate isolation is desired, allowing pillar 160 to provide for later gate isolation. As understood by one skilled in the art, a conventional gate cut isolation is typically created by forming an opening to the substrate in a dummy gate between active nanostructures, and filling the opening with an insulator that remains in place after dummy gate removal. Where a gate cut isolation is desired between certain parts of the PFET and NFET, a gate cut landing area, i.e., space between the PFET and NFET like first space 116, may not provide sufficient width to land a gate cut isolation using current processes. In order to address this situation, current practice is to reduce the width of active nanostructures and the respective NFET and PFET, where necessary, to enlarge the space (like first space 116), therebetween and create a larger gate cut isolation landing area. Unfortunately, this process requires formation of tapered NFET and PFET devices (e.g., with jogs and corners) that are hard to manufacture due to, e.g., nanostructure variability, proximity issues, lithography and patterning limits, etc. Further, the reduction in size of the FETs is typically accompanied by a reduction in performance of the FETs. Formation of isolation pillar 160 in gate region 80, as described, eliminates the need to create a larger gate cut isolation landing area.

FIGS. 8A and 8B show cross-sectional views of etching pillar material 158 in first gate region 80 (FIG. 8A) in which gate isolation is desired, and second gate region 82 (FIG. 8B) in which gate connection is desired. The etching may include any appropriate etching chemistry for pillar material 158, e.g., a RIE. In FIG. 8B, opening 172 in mask 170 allows pillar material 158 of upper portion 164 in second gate region 82 to be etched. In contrast, as shown in FIG. 8A, mask 170 prevents pillar material 158 of upper portion 164 in first gate region 80 to be etched. As a result, upper portion 164 in first gate region 80 (FIG. 8A) has a first height H1, and upper portion 164 in second gate region 82 (FIG. 8B) has a second height H2 that is less than first height H1. Pillar material 158 is etched away in both regions selectively to an upper surface 174 of sacrificial columns 150. FIGS. 9A and 9B show the structure after removal of sacrificial columns 150 (FIGS. 8A-B) and mask 170 (FIGS. 8A-B), e.g., by a conventional resist strip for mask 170 and an ashing process appropriate for sacrificial column 150 material. As shown in FIG. 9B, isolation pillar 160 in second gate region 82 has a T-shape cross-section, i.e., it is generally T-shape with some exceptions for rounded artifacts in some locations like a top of the 'T.'

FIGS. 10A and 10B show cross-sectional views of removing sacrificial layers 124 (FIG. 4) from first and second nanosheet stacks 120, i.e., after removing sacrificial columns 150 (FIGS. 8A-B) and capping layer 142 (FIGS. 8A-B). This process is sometimes referred to as "channel release" as it is forming the channel for the FETs. The process may include any now known or later developed etching process to remove capping layer 142 (FIGS. 9A-B) and sacrificial layers 124 (FIGS. 9A-B), selective to nanosheets 126. Any trimming process required to create the final size and shape of nanosheets 126 may be provided also at this stage. It is understood that where nanosheet stacks 122 are not employed, e.g., where fins or nanowires are used, this step may be skipped.

As shown in FIG. 10A, in first gate region 80 in which first and second active nanostructures 120P, 120N are to have separate gates, sacrificial columns 150 (FIGS. 8A-B) and capping layer 142 (FIGS. 8A-B) are removed such that upper portion 164 of isolation pillar 160 extends above upper surface 166 of first and second active nanostructures 120P, 120N to a first height H1. Further, as shown in FIG. 10B, in second gate region 82 in which first and second active nanostructures 120P, 120N are to share a gate, sacrificial columns 150 (FIGS. 8A-B) and capping layer 142 (FIGS. 8A-B) are removed such that upper portion 164 extends above upper surface 166 of first and second active nanostructures 120P, 120N to a second height H2 that is less than first height H1.

Figure 11:
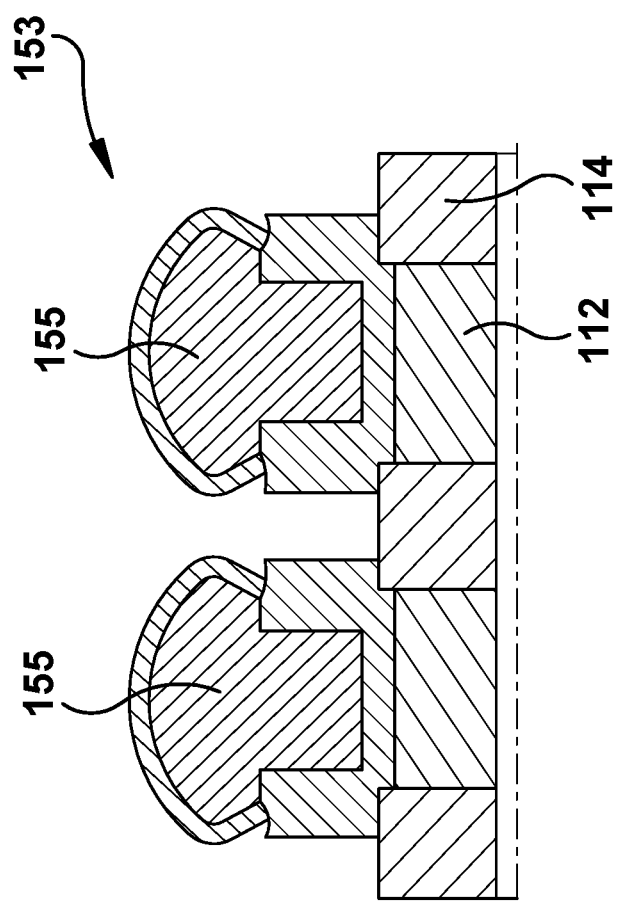
FIG. 11 shows a cross-sectional view of source/drain region formation in a source/drain area with no isolation pillar along view line 11-11 in FIG. 1, according to embodiments of the disclosure.

FIG. 11 shows a cross-sectional view through view line 11-11 in FIG. 1 of a source/drain (S/D) area 152, i.e., with active nanostructures 120N, 120P not visible because they are in another cross-sectional plane in the page of the drawings. As illustrated, isolation pillar 160 (FIGS. 10A-B) is not present between source/drain regions 154N, 154P. S/D regions 154, shown in FIG. 11, may be formed using any now known or later developed process including, for example, epitaxial growth of doped semiconductor at respective S/D region locations, i.e., having exposed semiconductor material. An annealing process may be carried out to drive in dopants into semiconductor material (not labeled) underlying S/D regions 154. As understood, where a dummy gate (not shown) is used, it protects other parts of the structure, e.g., active nanostructures 120N, 120P, during formation of S/D regions 154 and other processes (not all relevant to current disclosure) that occur at about the same time, e.g., anneals and other processes damaging to active nanostructures.

FIGS. 12A-B show cross-sectional views of depositing a high dielectric constant (high-K) layer 182 and a first metal 180 over first active nanostructure 120P, isolation pillar 160 and second active nanostructure 120N. Note, isolation pillar 160 is between active nanostructures 120N, 120P (in middle of drawing) but also at each end, i.e., isolation pillar 160 is formed around each nanosheet stack 122. High-K layer 182 acts as a gate dielectric for high-K metal gates (HKMG) of the FETs. High-K layer 182 is formed on substrate 112 and first and second active nanostructures 120P, 120N before the depositing of first metal 180. Examples of high-K material (having K higher than silicon oxide) include but are not limited to: metal oxides such as $Ta_2O_5$, $BaTiO_3$, $HfO_2$, $ZrO_2$, $Al_2O_3$, or metal silicates such as HfSixOy or HfSixOyNz, where x, y, and z represent relative proportions, each greater than or equal to zero and x+y+z=1 (1 being the total relative mole quantity). As understood in the art, first metal 180 may include a work function metal (WFM) for a particular type of FET, i.e., n-type or p-type. That is, first metal 180 may include a PFET work function metal or an NFET work function metal, depending on what type of FET is being built from first active nanostructure 120P. In the example shown, active nanostructure 120P will eventually become a PFET, hence first metal 180 will be a PFET WFM such as but not limited to: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Where active nanostructures 120P, 120N include nanosheets 126, the depositing of first metal 180 includes depositing the first metal such that the first metal surrounds each of nanosheets 126 of first active nanostructure 120P, and such that the first metal surrounds each of nanosheets 126 of second active nanostructure 120N. The depositing steps may include, for example, CVD, ALD, PECVD, etc.

Figures 14A, 14B:
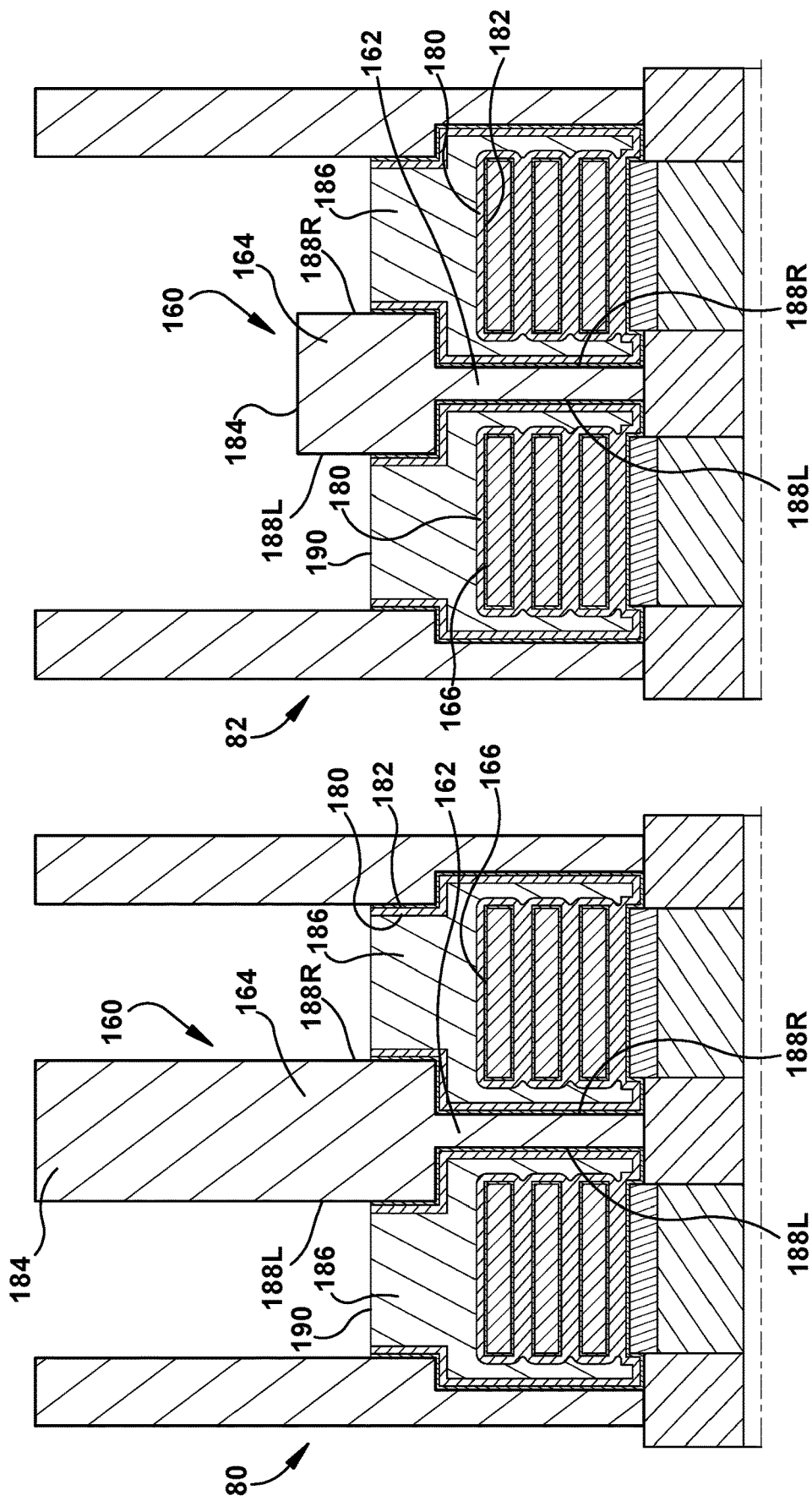
FIGS. 14A-B show cross-sectional views of removal of the high-K layer and first WFM from a part of the isolation pillar in the first and second gate regions along view lines A-A and B-B in FIG. 1, respectively, according to embodiments of the disclosure.

FIGS. 13A-B and 14A-B show cross-sectional views of removing first high-K layer 182 and first metal 180 from a part of isolation pillar 160. This process may include covering the first and second active nanostructures 120N, 120P with a protective layer 186, e.g., a soft mask material like silicon oxide or an organic planarization layer (OPL), and etching back protective layer 186 such that an upper surface 190 thereof is between top of upper end 184 of isolation pillar 160 and upper surface 166 of nanostructures 120N, 120P. As shown in FIGS. 13B and 14B, in second gate region 82, isolation pillar 160 has upper end 184 thereof sufficiently above upper surfaces 166 of active nanostructures 120N, 120P to allow the removal of first metal 180 and high-K layer 182 from part of isolation pillar 160. The part of isolation pillar 160 from which removal occurs may include any section that segregates or creates a gap in first metal 180 and segregates or creates a gap in high-K layer 182, i.e., it can be on an upper surface of upper end 184 of isolation pillar 160, on part of one or more sidewalls 188L, 188R (shown as both in FIG. 14B) of the T-shape top of upper portion 164, and/or perhaps on part of a sidewall 188L, 188R on lower portion 162 (if the latter is exposed by protective layer 186). This removal does not extend to active nanostructures 120N, 120P. Here, protective layer 186 covers active nanostructures 120N, 120P such that isolation pillar 160, where it is covered by high-K layer 182 and first metal 180, extends above upper surface 190 of protective layer 186. Similarly, as shown in FIGS. 13A and 14A, in first gate region 80, isolation pillar 160 also has upper end 184 thereof sufficiently above upper surfaces 166 of active nanostructures 120N, 120P to allow the removal of first metal 180 and high-K layer 182 from parts thereof such as sidewalls 188L, 188R in upper portion 164 thereof and perhaps sidewalls 188L, 188R of lower portion 162 (if exposed by protective layer 186), without removal from active nanostructures 120N, 120P.

As shown in FIGS. 14A-B, an etching may then be performed to remove at least first metal 180 from a part of isolation pillar 160, and from a top portion of the gate cavity, as recognized by one skilled in the art. Optionally, the etching may also remove high-K layer 182. This process is sometimes referred to as chamfering. The etching may include any appropriate etching process such as a RIE for high-K layer 182 (optionally) and first metal 180. As shown in FIGS. 14A-B, first metal 180 (and optionally high-K layer 182) includes a discontinuity separating first metal 180 over first active nanostructure 120P from first metal 180 (and optionally high-K layer 182) over second active nanostructure 120N. However, high-K layer 182 and first metal 180 may remain on opposing sidewalls 188L, 188R of isolation pillar 160, i.e., in lower portions 162 in each of first and second gate regions 80 (FIG. 14A), 82 (FIG. 14B), respectively. That is, in each gate region 80, 82, first metal 180 and high-K layer 182 may optionally be removed from some part of sidewalls 188L, 188R of lower portion 162 of isolation pillar 160, if exposed. Once completed, protective layer 186 may be removed, e.g., by an ashing process, as shown in FIGS. 15A-B.

FIGS. 16A-B and 17A-B shows cross-sectional views of removing first metal 180 surrounding second active nanostructure 120N. Here, as shown in FIGS. 16A-B, a mask 200 may be positioned to cover first active nanostructure 120P and can land on or even cover isolation pillar 160. In contrast to conventional processes, an edge 202 of mask 200 can land in a less precise manner so long as first active nanostructure 120P is covered because isolation pillar 160 (in first gate region 80) or discontinuity in first metal 180 on upper end 184 of isolation pillar 160 (in second gate region 82) prevent (wet) etching from reaching and removing first metal 180 on first active nanostructure 120P. In particular, in second gate region 82 (FIG. 17B) first metal 180 on at least sidewall 188L (left side in example shown) of isolation pillar 160 provides a controlled, directed and limited path through which wet etching may attempt to reach first active nanostructure 120P along sidewall 188L of lower portion 162. However, because first metal 180 is removed from at least sidewall 188L or 188R, i.e., below and/or over upper end 184, the wet etching cannot reach first metal 180 on first active nanostructure 120P. Even if the wet etching extends to an upper extent of sidewall 188L of isolation pillar 160 in lower portion 162, mask 200 interaction with the discontinuity in first metal 180 on sidewall 188L of isolation pillar 160 prevents the wet etching from reaching first metal 180 over first active nanostructure 120P. Consequently, as shown in FIGS. 17A-B, the wet etching can be aggressive and thorough. Further, the time required to remove first metal 180 from differently sized second active nanostructures 120N on an IC is irrelevant because, regardless of the length of time to remove them from the widest of second active nanostructures 120N, all of the other first active nanostructures 120P are protected. The wet etching may include any appropriate etching process(es) to remove first metal 180, e.g., RIEs. As shown in FIGS. 17A-B, where nanosheets 126 are used, high-K layer 182 (optional) and first metal 180 is removed by etching from between nanosheets 126 of second active nanostructure 120N.

FIGS. 18A-B and 19A-B show cross-sectional views of depositing a second metal 210 surrounding second active nanostructure 120N. As also shown in FIGS. 19A-B, second metal 210 may be deposited over each of first nanostructure 120P and second active nanostructure 120P (and isolation pillar 160). FIGS. 18A-B show removal of mask 200 (FIGS. 16A-17B), and FIGS. 19A-B shows depositing of second metal 210, e.g., by CVD or other appropriate deposition technique. Second metal 210 includes the other of the PFET work function metal and the NFET work function metal. In this example, second metal 210 may include an NFET work function metal such as but not limited to: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Where nanosheets 126 are employed, as shown in FIGS. 19A-B, second metal 210 may be deposited such that it surrounds each of nanosheets 126 of second active nanostructure 120N and, if desired, first active nanostructure 120N. With regard to first active nanostructure 120P, second metal 210 may fill any voids between first metal 180 on nanosheets 126 and first metal 180 on adjacent sidewall 188R of isolation pillar(s) 160 in lower portion 162, and it may also cover first metal 180. First active nanostructure 120P now forms part, i.e., channel with a gate 246 (FIGS. 19A-B), of a PFET 222, and second active nanostructure 120N now forms part, i.e., channel within a gate 242 (FIGS. 19A-B), of an NFET 224. As shown in FIG. 19B, in second gate region 82, the depositing of second metal 210 includes depositing the second metal such that the second metal extends over upper end 184 of upper portion 164 of isolation pillar 160. (This is not the case in first gate region 80 (e.g., FIG. 19A) in which intermediate planarization steps remove second metal 210 from upper end 184 of upper portion 164.) That is, in second gate region 82, second metal 210 extends over isolation pillar 160 and active nanostructures 120N, 120P to electrically connect gate 246 for PFET 222 and gate 242 for NFET 224 together. That is, NFET 224 and PFET 222 share an electrically connected gate 242, 246. Hence, an additional metal deposition and patterning may not be mandatory to reconnect N and P gates together, which is advantageous because, due to the small spacing, gate metal such as tungsten (W) or cobalt (Co), may not be able to fit in the space. This arrangement also advantageously may reduce gate end capacitance.

FIG. 20B shows an optional embodiment in which a gate metal layer 230 is formed over second metal 210, i.e., to further electrically connect NFET 224 and PFET 222 in second gate region 82. FIG. 20A shows an optional embodiment in which gate metal layer 230 is formed over second metal 210 to provide further conductivity and contact landing area to each respective electrically isolated gate of NFET 224 and PFET 222, i.e., in first gate region 80. Gate metal layer 230 may include any now known or later developed gate metal such as but not limited to tungsten (W) or cobalt (Co). Gate metal layer 230 may be formed using any appropriate deposition process for the metal, perhaps followed by a planarization step. As noted, in second gate region 82 (FIG. 20B), even where gate metal layer 230 cannot or is not used, NFET 224 and PFET 222 are electrically connected by second metal 210.

Referring to FIGS. 19A-B and 20A-B, a field effect transistor (FET) structure 240 according to embodiments of the disclosure may include: a first type FET, e.g., NFET 224, having active nanostructure 120N on substrate 112, a gate 242 having high-K layer 182 and second metal (WFM) 210 surrounding active nanostructure 120N and a source/drain (S/D) region 154N (FIG. 11) at each of opposing ends of active nanostructure 120N. FET structure 240 may also include a second type FET, e.g., PFET 222, having active nanostructure 120P on substrate 112 adjacent to active nanostructure 120N and separated by space 244. PFET 222 may include a gate 246 having high-K layer 182, first metal 180 and second metal 210 surrounding active nanostructure 120P, and a source/drain (S/D) region 154P (FIG. 11) at each of opposing ends of active nanostructure 120P. Second metal (WFM) 210 is different than first metal 180 to provide the desired WFM for each FET. In FET structure 240, isolation pillar 160 is positioned between active nanostructures 120N, 120P in space 244.

Isolation pillar 160 includes lower portion 162 positioned between first and second active nanostructures 120P, 120N in space 244 and a unitary, wider, upper portion 164 extending above upper surface 166 of first and second active nanostructures 120P, 120N. As shown in FIGS. 19A-B, in one embodiment, one of WFMs 180, 210, i.e., the WFM for the first formed FET, extends along a sidewall (e.g., first metal (WFM) 180 on sidewall 188R as illustrated) of isolation pillar 160 but not over upper end 184 thereof. This situation exists in both first and second gate regions 80, 82. In the example described, first metal 180 (and high-K layer 182) for PFET 222 extends only along a sidewall 188R of isolation pillar 160 and not over upper end 184 (of upper portion 164) thereof, i.e., because PFET 222 is formed first. It is appreciated that if NFET 224 was formed first, WFM 210 would extend along sidewall 188L and not over upper end 184 (of upper portion 164) of isolation pillar 160.

FET structure 240 includes second gate region 82 (FIGS. 19B, 20B) in which gates 242, 246 of FETs 222, 224 are electrically connected by at least the other one of the first and second WFMs, e.g., at least second metal (WFM) 210 (FIG. 19B) and optionally metal gate layer 230 (FIG. 20A). More particularly, in second gate region 82 in which gates are to be shared, the other one of WFMs (second WFM 210), extends over isolation pillar 160 including upper end 184 thereof to electrically connect gates 242, 246 of NFET 224 and PFET 222 together. Here in second gate region 82, the unitary, wider, upper portion 164 of isolation pillar 160 extends above upper surface 166 of first and second active nanostructures 120P, 120N to a height H2 (FIGS. 19B, 20B) that is less than a height H1 thereof in first gate region 80 (FIGS. 19A, 20A). As noted, isolation pillar 160 in second gate region 82 has a T-shape cross-section, i.e., it is generally T-shape with some exceptions for rounded artifacts in some locations like a top of the 'T.'

In addition, as shown in FIGS. 19A and 20A, FET structure 240 includes first gate region 80 in which gates 242, 246 of FETs 222, 224 are electrically isolated by isolation pillar 160, i.e., they are not electrically connected. More specifically, in first gate region 80, isolation pillar 160 creates a gate cut isolation 212 between NFET 224 and PFET 222 without the need to enlarge the spacing therebetween, eliminating the complexity and performance impact due to the tapered NFET and PFET (FIG. 1). That is, isolation pillar 160 creates gate cut isolation 212 by way of its height H1. Because isolation pillar 160/gate cut isolation 212 is built in-place, a larger gate cut landing area 30 (FIG. 1) is not required, and active nanostructures 120N, 120P do not need to be adjusted to form gate cut landing area 30 (FIG. 1)—N-P space 32 (FIG. 1) can be the same narrower width along the entire length of active nanostructures 120P, 120N. Further, upper portion 164 being wider than lower portion 162 of isolation pillar 160, allows use of conventional or even relaxed gate cut isolation masks, etc., to be employed. Upper portion 164 of isolation pillar 160 can also extend over NFET 224 and/or PFET 222 because upper portion 164 only needs to extend to lower portion 162 of isolation pillar 160, not between the FETs. Hence, the precision at which upper region 164 must be formed is relaxed because lower portion 162 is present, i.e., again, gate cut landing space 30 (FIG. 1) does not have to be enlarged to allow lower portion 162 of isolation pillar 160 to land between NFET 224 and PFET 222. It is noted that the teachings of the disclosure relative to isolation pillar 160 are applicable to form gate cut isolation 212 between any two FETs, not just an NFET and a PFET.

As shown in FIGS. 20A-B, FET structures 240 may also optionally include gate metal layer 230, e.g., W or Co, over WFM(s) 180, 210. As shown in FIG. 20A, gate metal layer 230 extends over an uppermost WFM, e.g., WFM 210, over first active nanostructure 122P and second active nanostructure 120N in first gate region 80, but isolation pillar 160 keeps gates 242, 246 electrically isolated. In first gate region 80 (FIG. 20A), gate metal layer 230 provides, among other things, a larger contact landing area for gates 242, 246. In contrast, as shown in FIG. 20B, in second gate region 82, gate metal layer 230 extends over WFMs 180, 210 to further electrically connect gates 242, 246 of NFET 224 and PFET 222 together.

As noted, in one embodiment, each of active nanostructures 120N, 120P may include a nanosheet stack 122 such that each WFM 180, 210 surrounds respective nanosheets 126. As will be appreciated by those with skill in the art, the teachings of the disclosure are equally applicable to other forms of active nanostructures, e.g., fins, nanowires, etc. Further, while the teachings of the disclosure are described relative to an isolation pillar 160 between an NFET and PFET, i.e., for N-P space, isolation pillar 160 may also be formed in spaces between same types of FETS, i.e., in N-N space and P-P space.

Embodiments of the disclosure enable robust first gate, e.g., PFET gate 246, formation for gate-all-around active nanostructures at scaled N-to-P spaces, e.g., at 7 nm technology node, required for the later formed second gate, e.g., NFET gate 242. The teachings of the disclosure also improves integration robustness by relaxing requirements on selected lithographic steps (e.g., from extreme ultraviolet (EUV) techniques to non-EUV techniques) such as: edge placement of removal mask 200 (FIGS. 17A-B) for first metal 180. With regard to gate cut isolation 212 formation, the disclosure enables gate cut isolation formation (with gates or using replacement metal gate (RMG) processing) with the above-noted relaxed lithographic requirements, and eliminates the need to form tapered devices, e.g., with jogs or corners in the devices. Embodiments of the method also provide for self-aligned structures, reducing the impact of edge placement errors. Further, the wider topped, T-shaped pillar everywhere between N and P gates, even where they connect together, provides lower N to P gate parasitic capacitance. Advantageously, embodiments of the disclosure also do not require additional materials.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A field effect transistor (FET) structure, comprising:
   a first type field effect transistor (FET) having: a first active nanostructure on a substrate, a gate having a high dielectric constant (high-K) layer and a first work function metal (WFM) surrounding the first active nanostructure, and a source/drain (S/D) region at each of opposing ends of the first active nanostructure;
   a second type field effect transistor (FET) having: a second active nanostructure on the substrate adjacent to the first active nanostructure and separated by a space, the second FET further including a gate having the first WFM and a second work function metal (WFM) surrounding the second active nanostructure, and a source/drain (S/D) region at each of opposing ends of the second active nanostructure, the second WFM being different than the first WFM; and
   an isolation pillar including a lower portion positioned between the first and second active nanostructures in the space and a unitary, wider, upper portion extending above an upper surface of the first and second active nanostructures,
   wherein one of the first and second WFMs extends along a sidewall of the isolation pillar but not over a part of the isolation pillar.

2. The FET structure of claim 1, further comprising a first gate region in which the gates of the first and second FETs are electrically isolated by the isolation pillar and a second gate region in which the gates of the first and second FETs are electrically connected by at least the other one of the first and second WFMs,
   wherein the unitary, wider, upper portion of the isolation pillar extends above the upper surface of the first and second active nanostructures to a first height in the first gate region, and to a second height that is lower than the first height in the second gate region.

3. The FET structure of claim 2, wherein the isolation pillar in the second gate region has a T-shape cross-section.

4. The FET structure of claim 2, wherein the other one of the first and second WFMs extends over the isolation pillar including an upper end thereof to electrically connect the gates of the first FET and the second FET together in the second gate region.

5. The FET structure of claim 2, further comprising a gate metal layer over the first and second WFMs to electrically connect the gates of the first FET and the second FET together in the second gate region.

6. The FET structure of claim 2, further comprising a gate metal layer over an uppermost WFM over the first active nanostructure and the second active nanostructure in the first gate region.

* * * * *